US012601855B2

(12) United States Patent
Lin et al.

(10) Patent No.: US 12,601,855 B2
(45) Date of Patent: Apr. 14, 2026

(54) SYSTEM AND METHOD FOR ENVIRONMENT-DEPENDENT PROBABILISTIC TROPICAL CYCLONE MODELING

(71) Applicant: The Trustees of Princeton University, Princeton, NJ (US)

(72) Inventors: Ning Lin, Princeton, NJ (US); Renzhi Jing, Princeton, NJ (US)

(73) Assignee: THE TRUSTEES OF PRINCETON UNIVERSITY, Princeton, NJ (US)

( * ) Notice: Subject to any disclaimer, the term of this patent is extended or adjusted under 35 U.S.C. 154(b) by 392 days.

(21) Appl. No.: 17/629,581

(22) PCT Filed: Jul. 29, 2020

(86) PCT No.: PCT/US2020/043952

§ 371 (c)(1),
(2) Date: Jan. 24, 2022

(87) PCT Pub. No.: WO2021/021852

PCT Pub. Date: Feb. 4, 2021

(65) Prior Publication Data

US 2022/0268963 A1      Aug. 25, 2022

Related U.S. Application Data

(60) Provisional application No. 62/881,753, filed on Aug. 1, 2019.

(51) Int. Cl.
*G01W 1/10* (2006.01)
*G06F 18/20* (2023.01)
(Continued)

(52) U.S. Cl.
CPC ........... *G01W 1/10* (2013.01); *G06F 18/2415* (2023.01); *G06F 18/295* (2023.01); *G06F 30/10* (2020.01)

(58) Field of Classification Search
CPC .... G01W 1/10; G06F 18/2415; G06F 18/295; G06F 30/10
See application file for complete search history.

(56) References Cited

U.S. PATENT DOCUMENTS 7,734,245 B2      6/2010   Ravela et al.
8,224,768 B1      7/2012   Crawford et al.
(Continued)

FOREIGN PATENT DOCUMENTS

CN           107229825 A   *  10/2017

OTHER PUBLICATIONS

Jing, Renzhi., Lin, Ning. "Tropical Cyclone Intensity Evolution Modeled as a Dependent Hidden Markov Process". Cornell University., https://doi.org/10.48550/arXiv.1808.05276, pp. 1-54., Wed, Aug. 15, 2018 (Year: 2018).*

(Continued)

*Primary Examiner* — Yoshihisa Ishizuka

(74) *Attorney, Agent, or Firm* — MEAGHER, EMANUEL, LAKS, GOLDBERG & LIAO, LLP

(57) ABSTRACT

According to various embodiments, a machine-learning based system for simulating tropical cyclones (TCs) and assessing TC risk is disclosed. The system includes a hierarchical Poisson genesis module configured to develop a Poisson regression and TC genesis simulation on a plurality of clustering grids. The system further includes an analog-wind track module configured to determine movement of a TC by both analog predictors formed by historical track patterns and current in situ wind. The system additionally includes a Markov intensity module configured to determine intensity change of the TC by considering three hidden discrete states of storm intensity change and associating each state with a probability distribution of intensity change.

27 Claims, 18 Drawing Sheets

(51) Int. Cl.
    *G06F 18/2415*     (2023.01)
    *G06F 30/10*     (2020.01)

(56)             References Cited

U.S. PATENT DOCUMENTS

| | | | |
|---|---|---|---|
| 2004/0143396 A1* | 7/2004 | Allen | G01W 1/10 |
| | | | 702/3 |
| 2007/0168155 A1 | 7/2007 | Ravella et al. | |
| 2013/0132045 A1 | 5/2013 | Mello et al. | |
| 2017/0176640 A1* | 6/2017 | Kodra | G01W 1/06 |
| 2019/0004210 A1* | 1/2019 | Altschule | G01W 1/14 |
| 2019/0228362 A1* | 7/2019 | Anagnostou | G06Q 10/0635 |

OTHER PUBLICATIONS

International Search Report and Written Opinion for corresponding PCT Application No. PCT/US2020/043952, dated Nov. 17, 2020.
Jing et al., "Tropical Cyclone Intensity Evolution Modeled as a Dependent Hidden Markov Process", Cornell University [online], pp. 1-54, publishesd Aug. 15, 2018, [retrieved on Oct. 14, 2020]. Retrieved from the Internet <URL:https://arxiv.org/abs/1808.05276.
Tippett et al., "A Poisson Regression Index for Tropical Cyclone Genesis and the Role of Large-Scale Vorticity in Genesis", Journal of Climate, vol. 24 [online], pp. 2335-2357, published May 1, 2011, [retrieved on Oct. 14, 2020]. Retrieved from the Internet< URL: https://journals.ametsoc.org/jcli/article/24/9/2335/33449.
Emanuel et al., "A Statistical Deterministic Approach to Hurricane Risk Assessment", Bulletin of the American Meteorological Society, vol. 87, No. 3, pp. 299-314, Mar. 2006.
Emanuel et al., "Hurricanes and global warming: Results from downscaling IPCC AR4 simulations", Bulletin of the American Meteorological Society, vol. 89, pp. 347-367, Mar. 2008.
Lee et al., "An Environmentally Forced Tropical Cyclone Hazard Model", Journal of Advances in Modeling Earth Systems, vol. 107 (D22), Wiley-Blackwell: 8611, pp. 223-241, Jan. 20, 2018.
Mudd et al, "Hurricane wind hazard assessment for a rapidly warming climate scenario", Journal of Wind Engineering, vol. 133, pp. 242-249, 2014.

* cited by examiner

Coefficients of the Clustering-based Genesis Model

| Intercept | PI | RH | VO | SHR |
|---|---|---|---|---|
| -4.084 | 1.334 | 0.725 | 0.942 | -0.816 |

Performance of analog track model and analog-wind track model. The numbers shown are percent of the variance explained by the model ($R^2$) for 6-hourly displacement in zonal and meridional directions, using training dataset and testing dataset

|  | Zonal | | Meridional | |
| --- | --- | --- | --- | --- |
|  | Train | Test | Train | Test |
| Analog | 0.95 | 0.93 | 0.89 | 0.83 |
| Analog-wind | 0.95 | 0.93 | 0.90 | 0.84 |

*FIG. 7*

6 Hour Meridional Displacements (deg lat)

6 Hour Zonal Displacements (deg lat)

- - - - Estimation from Historical Record
—o— Median from 100 Simulations Over 36 Years
0 to 100 Percentiles from
100 Simulations Over 36 Years
—·— Calculation Using All 3600-year Simulations

SYSTEM AND METHOD FOR ENVIRONMENT-DEPENDENT PROBABILISTIC TROPICAL CYCLONE MODELING

CROSS-REFERENCE TO RELATED APPLICATIONS

This application claims priority to provisional application 62/881,753, filed Aug. 1, 2019, which is herein incorporated by reference in its entirety.

STATEMENT REGARDING FEDERALLY SPONSORED RESEARCH OR DEVELOPMENT

This invention was made with government support under Grant No. CMMI-1652448 awarded by the National Science Foundation and Grant No. NA14OAR4320106 awarded by the National Oceanic and Atmospheric Administration (NOAA). The government has certain rights in the invention.

FIELD OF THE INVENTION

The present invention relates generally to storm assessment and, more particularly, to a system and method for generating synthetic tropical cyclones based on a hierarchical Poisson genesis model, an analog-wind track model, and a Markov intensity model.

BACKGROUND OF THE INVENTION

Tropical cyclones (TCs) are among the most deadly and destructive natural phenomena in the world. Accounting for 17% of the total number of billion-dollar weather and climate disasters, TCs caused more than 50% of the total damages, according to Smith and Matthews (2015) in a study of U.S. climate disasters in 1980-2013. Continuously improving our understanding of TC-related hazards and risk under current and future climates is of great importance.

There are two general approaches to assess TC hazards (i.e., extreme winds, heavy rainfall, and storm surges) and risk. Local models estimate TC hazards at a specific location of interest based on historical TCs that affected the region or larger synthetic TC datasets generated based on those historical TCs. These site-specific models perform relatively well in regions with high TC activity but are not accurate when historical data are limited. To overcome the data limitation at the local scale, basin-wide models make use of all historical storms in the ocean basin to generate synthetic TCs from genesis to lysis over the entire basin.

Ideally, the generated synthetic TCs are fully dependent on the storm environment so that they vary consistently with the change of the climate conditions. However, most synthetic TC models currently in use are largely climate invariant. These models are not suitable for risk assessment under a changing climate. More recent models have started to include environmental dependence by adding large-scale environmental predictors, such as El Nino-Southern Oscillation (ENSO) indices. Though such a model can better capture the effect of ENSO state on TC seasonality, the large-scale indices have limited capability in reproducing local variations.

One statistical-deterministic model has become a principle method that can generate large numbers of synthetic TCs at the basin scale driven by comprehensive local climate conditions. The model applies a random seeding method to initiate the storm, a beta and advection model (BAM) based on local winds to propagate the storm, and a deterministic Coupled Hurricane Intensity Prediction System (CHIPS) model to estimate the storm intensity based on local thermodynamic state of the atmosphere and ocean. The model has been widely applied to assess TC wind, rainfall, and storm surge hazards and TC economic losses, under current and future projected climate conditions. In this model, however, since the genesis is not directly dependent on the environment, but determined by the intensity model, the estimated storm frequency needs to be calibrated, which is a challenge, particularly for climate change analysis. Also, the BAM determines the storm track based on only local winds, inducing significant uncertainties as the local winds fluctuate greatly. More recently, a synthetic TC model was developed that also depends on the local environment but is based purely on statistical modeling. In this model, the genesis formation is simulated on regular grids over the ocean basin based on a Poisson regression on the TC genesis index (TCGI; dependent on absolute vorticity, relative humidity, relative SST, vertical wind shear, and storm location), the storm is propagated based on a revised BAM with the beta drift dependent on the storm location, and the storm intensity is estimated based on a multiple linear regression on environmental (potential intensity, wind shear, relative humidity) and storm (current intensity, previous-step intensity change, and translation speed) variables plus a stochastic error term. This model has limited capability in capturing the extremes. Given the sparsity of the genesis data, applying the Poisson regression model on regular grids leads to the zero-inflation problem and reduced spatial and temporal variation of the genesis. Also, the linear regression intensity model cannot capture the heterogeneity in TC intensification well, which is of great importance in modeling TC extreme (de)intensification.

As such, there is a need for a climate-variant synthetic TC model that can better capture TC frequency and interannual variability, track patterns and variations, and intensity extremes associated with rapid intensification.

SUMMARY OF THE INVENTION

According to various embodiments, a machine-learning based system for simulating tropical cyclones (TCs) and assessing TC risk is disclosed. The system includes a hierarchical Poisson genesis module configured to develop a Poisson regression and TC genesis simulation on a plurality of clustering grids. The system further includes an analog-wind track module configured to determine movement of a TC by both analog predictors formed by historical track patterns and current in situ wind. The system additionally includes a Markov intensity module configured to determine intensity change of the TC by considering three hidden discrete states of storm intensity change and associating each state with a probability distribution of intensity change.

According to various embodiments, a machine-learning based method for simulating TCs and assessing TC risk is disclosed. The method includes estimating a location and time of storm formation via a genesis module. The genesis module is configured to develop a Poisson regression and TC genesis simulation on a plurality of clustering grids. The method further includes estimating movement of the storm via a track module. The track module is configured to determine movement of a TC by both analog predictors formed by historical track patterns and current in situ wind. The method additionally includes estimating change of intensity of the TC via an intensity module. The intensity module is configured to determine intensity change of the TC by considering three hidden discrete states of storm intensity change and associating each state with a probability distribution of intensity change.

According to various embodiments, a non-transitory computer-readable medium having stored thereon a computer program for execution by a processor configured to perform a machine-learning based method for simulating TCs and assessing TC risk is disclosed. The method includes estimating a location and time of storm formation via a genesis module. The genesis module is configured to develop a Poisson regression and TC genesis simulation on a plurality of clustering grids. The method further includes estimating movement of the storm via a track module. The track module is configured to determine movement of a TC by both analog predictors formed by historical track patterns and current in situ wind. The method additionally includes estimating change of intensity of the TC via an intensity module. The intensity module is configured to determine intensity change of the TC by considering three hidden discrete states of storm intensity change and associating each state with a probability distribution of intensity change.

Various other features and advantages will be made apparent from the following detailed description and the drawings.

BRIEF DESCRIPTION OF THE DRAWINGS

In order for the advantages of the invention to be readily understood, a more particular description of the invention briefly described above will be rendered by reference to specific embodiments that are illustrated in the appended drawings. Understanding that these drawings depict only exemplary embodiments of the invention and are not, therefore, to be considered to be limiting its scope, the invention will be described and explained with additional specificity and detail through the use of the accompanying drawings, in which:

FIG. 7 depicts a table of performance of an analog track model and analog-wind track model according to an embodiment of the present invention;

DETAILED DESCRIPTION OF THE INVENTION

Figure 1:
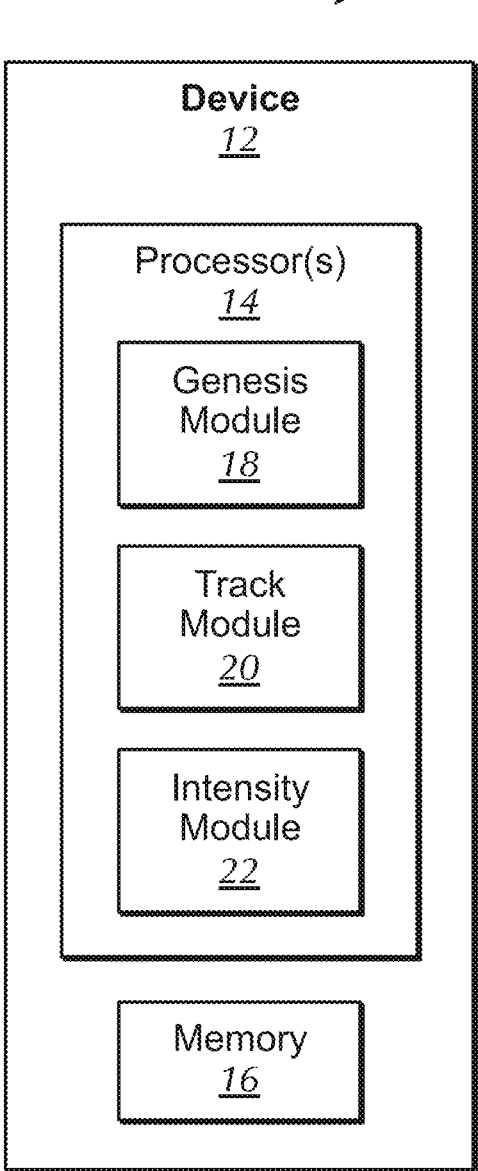
FIG. 1 depicts a block diagram of a system for implementing an environment-dependent probabilistic tropical cyclone (TC) model according to an embodiment of the present invention.

Generally disclosed herein are embodiments for an environment-dependent probabilistic tropical cyclone (TC) model for generating synthetic TCs to support TC risk assessment. Embodiments of the model generally include three components: a hierarchical Poisson genesis model (a genesis model that simulates the time and location of a storm's formation), an analog-wind track model (a track model that simulates the storm's movement), and a Markov intensity model (an intensity model that simulates the storm's maximum wind speed evolving along the track). The three model components are dependent on environmental variables that vary with the climate, including but not limited to potential intensity, advection flow, vertical wind shear, relative humidity, and ocean-cooling parameters.

The model's performance was evaluated by comparing simulated TCs with historical records in the North Atlantic Basin. The three model components and the integrated model are verified against observations using out-of-sample testing. The model can generally capture the TC climatology and reproduce statistics of TC genesis, movement, rapid intensification, and lifetime maximum intensity, as well as local landfall frequency and intensity. It can be coupled with climate models and TC hazard models to quantify TC-related wind, surge, and rainfall risks under various climate conditions.

Generally disclosed herein are embodiments for a climate-dependent probabilistic TC model. Embodiments of the model may be referred to herein as PepC, short for Princeton environment-dependent probabilistic tropical cyclone model. PepC includes three components: a hierarchical Poisson genesis model, an analog-wind track model, and a Markov intensity model. The genesis model is developed based on a Poisson regression on four environmental variables: the potential intensity, relative humidity, wind shear, and absolute vorticity. Unlike prior models, the Poisson regression and genesis simulation are performed on clustering grids (formed based on the variation of the environmental variables), to avoid the zero-inflation problem associated with regressing sparse genesis data on a regular grid. The analog-wind track model determines the storm track based on local in situ wind as well as historical track patterns, to overcome the regression challenge induced by the naturally large variations and uncertainties of local winds. The intensity component, the Markov environment-dependent hurricane intensity model (MeHiM), lets the storm evolve among different states of intensity change (i.e., slow, moderate, and rapid) as a response to the change of environmental variables (potential intensity, relative humidity, wind shear, and an ocean feedback parameter), lifting the basic assumption of a linear model that the response of intensity change to the environmental change is homogenous. These changes/improvements of the model components over previous models may help better capture TC frequency and interannual variability, track patterns and variations, and intensity extremes associated with rapid intensification, supporting improved TC hazard and risk analysis.

To verify the performance of PepC, each model component is first evaluated and then the integrated modeling system is evaluated, by comparing observed and simulated TC climatology over the North Atlantic (NA) basin. As the genesis model simulates local counts based on local environmental parameters, it is examined whether the model can reproduce basin-wide interannual, seasonal, and spatial distributions of observed genesis. Also, it is evaluated if the track model can reproduce observed distribution of track density over the basin and landfall frequency along the Mexico and U.S. East and Gulf coastlines. Then, the intensity component (MeHiM) is coupled with the genesis and track components to investigate if the integrated TC model PepC can capture the statistics of rapid intensification, lifetime maximum intensity, and landfall frequency and intensity.

System Overview

FIG. 1 illustrates a system 10 configured to implement the PepC model described above. The system 10 includes a device 12, which may be implemented in a variety of configurations including general computing devices such as but not limited to desktop computers, laptop computers, and network appliances or mobile devices such as but not limited to mobile phones, smart phones, smart watches, and tablet computers. The variety of configurations may include a central processing unit (CPU), a graphics processing unit (GPU), or an application-specific integrated circuit (ASIC), as nonlimiting examples. The device 12 includes one or more processors 14 for performing specific functions and memory 16 for storing those functions. The processors 14 include a genesis module 18, a track module 20, and an intensity module 22 for implementing the disclosed TC modeling generally described above and to be more specifically described below. The framework for the genesis module 18, track module 20, and intensity module 22 will be described in greater detail below. It is also to be noted the training process for the genesis module 18, tracking module 20, and intensity module 22 may be implemented in a variety of configurations (having a central processing unit (CPU), graphics processing unit (GPU), or application-specific integrated circuit (ASIC), as nonlimiting examples), such as but not limited to desktop computers, laptop computers, tablet computers, and servers.

Data

The genesis 18 and intensity 22 components are developed based on historical records from 1979 to 2014 in the NA basin, while the track 20 component is developed based on historical records from 1979 to 2014 as well as 1948 to 1979 (to generate analog track information). The TC dataset is taken from the IBTrACS WMO archive. It includes for each storm 6-hourly latitude and longitude positions and 10-minute maximum sustained wind speeds at 10 m above the sea surface, which are used to calculate the storm's current intensity change (DV), previous-step intensity change (DVp), and current intensity (V).

The atmospheric variables are derived from the ERA-Interim Reanalysis with a resolution of $0.75° \times 0.75°$ produced by the European Centre for Medium-Range Weather Forecasts (ECMWF). Storm's potential intensity, PI, is derived from the environmental thermodynamic state. The mid-level relative humidity, RH, is computed as the averaged relative humidity in the layer between 500 and 700 hPa within the 500- to 800-km annulus around the storm center. The low-level relative vorticity is defined as the vorticity at 850 hPa, averaged over the 200- to 800-km annulus around the storm center. The absolute vorticity, VO, is computed as the sum of relative vorticity and the vorticity of the earth. The deep layer vertical wind shear, SHR, is defined as the difference between the 850- and 200-hPa level winds, averaged over the 200- to 800-km annulus around the storm center. The 850- and 250-hPa level winds used in the track model are also averaged over the 200- to 800-km annulus around the storm center. In addition to atmospheric variables, an ocean feedback parameter (OCN) is used to represent the ocean's negative impact on storm intensification. The OCN is dependent on storm's translation speed, ocean mixed later depth, and thermal stratification below the ocean mixed layer. The ocean's salinity and potential temperature are taken from the Ocean Reanalysis System 4 (ORAS4). It is to be noted these data are exemplary and not intended to be limiting.

Here, the genesis 18 component is developed to predict TC formation based on PI, SHR, VO, and RH. The track 20 component is developed to predict TC movement based on local winds and analog predictors formed by historical track patterns. In MeHiM 22, DV is estimated based on six variables: DVp, V, PI, SHR, RH, and OCN.

Model Components: Genesis 18

The genesis model 18 component determines how many storms form in a year and where they originate over the ocean basin. Previous genesis models may be roughly classified into two categories. In the first category, the genesis rate and origination rely little on environmental variables.

Instead, the starting position and time of the storms are directly sampled from the historical data. The second category includes multiple TC genesis indices based on large-scale environmental parameters. Although dependent on environmental variables and applicable for climate change studies, these TC genesis indices have limitations in simulating the accurate number of storms on both seasonal and interannual scales. According to a recent study comparing the TC genesis indices, all indices tend to overestimate cyclogenesis during unfavorable seasons and strikingly underestimate the amplitude of interannual variability. Also, almost all indices tend to have an equatorward bias in predicting the cyclogenesis areas. Considering these limitations, a new climate-dependent TC genesis model 18 has been developed particularly focusing on the model's ability to capture the temporal and spatial variations of storm genesis.

A Poisson framework is applied to model TC genesis on a local grid scale (rather than on the basin scale). The Poisson framework assumes that the forming TCs are conditionally independent (given the climate environment), and one storm would not affect the other. Though special cases exist when storms appear to be close together at the same time or even collide, these events are rare and not well understood. Given Poisson-distributed TC genesis, the annual count of storms over the basin is theoretically Poisson distributed, which was shown to be approximately consistent with observational data. In addition, TC landfall theoretically follows a Poisson process, which is also consistent with observations. Under the Poisson framework, the expected number of TC genesis events is log-linearly dependent on the climate variables:

$$\log(\text{TCGR})=b+b_{VO}VO+b_{SHR}SHR+b_{RH}RH+b_{PI}PI \quad (1)$$

where TC genesis rate (TCGR) represents the expected number of storms in a grid cell. VO, SHR, RH, and PI are grid-averaged monthly mean absolute vorticity at 850 hPa, vertical wind shear between the 850 and 200 hPa levels, relative humidity at 600 hPa, and potential intensity, respectively. It is to be noted these numbers are exemplary and not intended to be limiting. Unlike prior models using relative SST, the more comprehensive PI is selected as the thermodynamical variable, which is also consistent with the intensity component of PepC. Also, the location term used by some prior models is removed, so that the model contains only physical climate variables and does not depend on historical genesis locations. RH is selected to represent the dependence on water vapor. The effect of the variable selection between RH and another humidity variable, entropy deficit, is discussed further below.

A more significant difference from the prior models is that instead of using regular grids, the Poisson regression model is fit based on clustering grids that contain similar environmental states that are characterized by PI, SHR, RH and VO. Given the sparsity of the genesis data, applying the Poisson regression model on regular grids has challenges. Applying a relatively large grid size will smooth out variations and underestimate extremes, while applying a relatively small grid size will induce excess zeroes, leading to a zero-inflation problem. In either situation, the magnitude of spatial and temporal variations will be reduced. On the other hand, clustering grids can be subjectively set to avoid this dilemma, helping to reconcile the spatial continuity of the environment fields and discreteness of storm occurrences.

Figure 2:
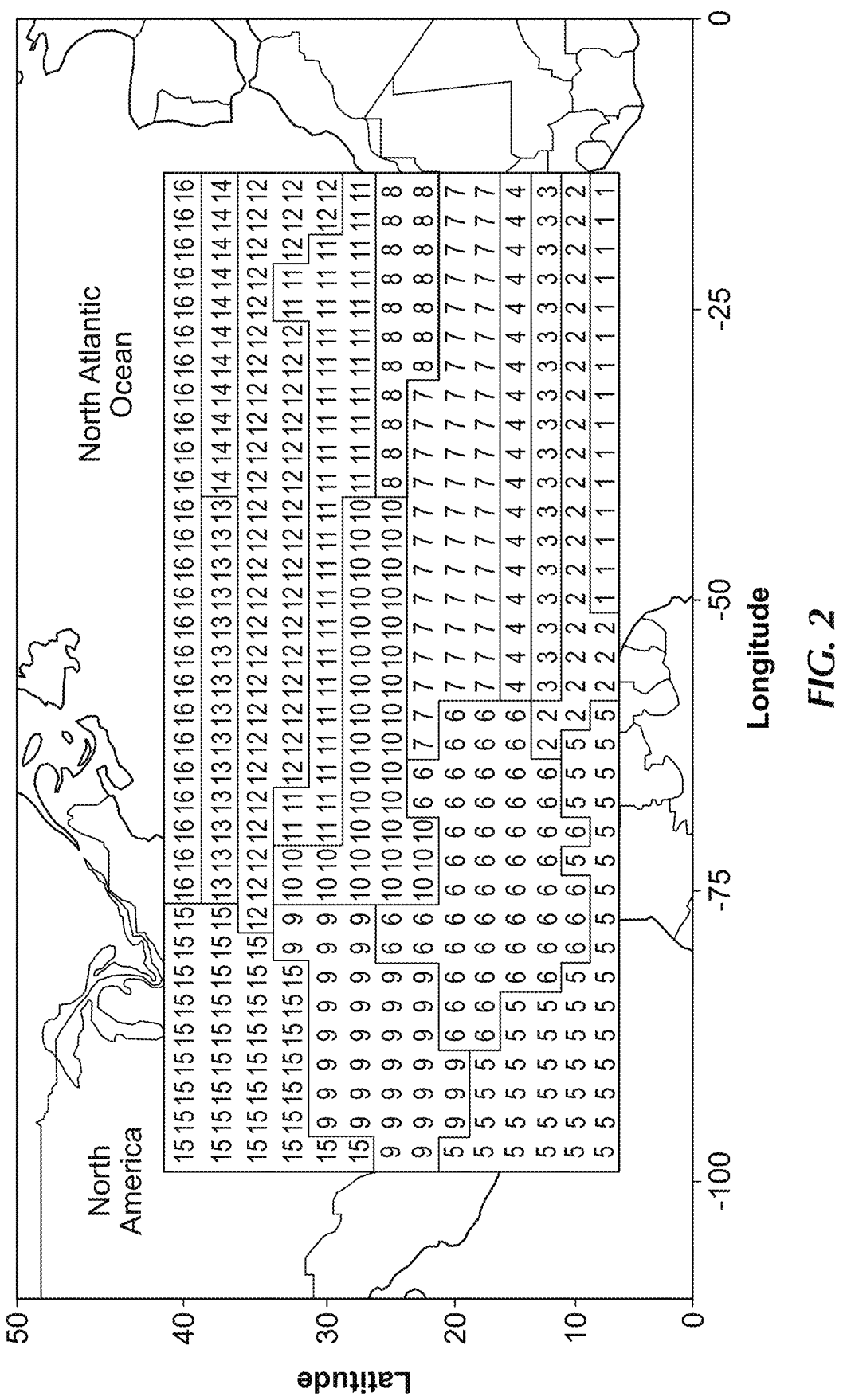
FIG. 2 depicts an example of graph-based segmentation over the North Atlantic basin for genesis modeling according to an embodiment of the present invention.

Specifically, for each month of each year in the training dataset, first the entire basin (7.5-40° N, 262.5-346° E) is divided into regular grids at a spatial resolution of 2.5°×2.5°, and then the regular grids are grouped into clustering grids according to the similarity of the monthly grid-averaged environmental fields. To do so, a graph-based clustering method is applied, rather than the traditional k-means clustering, to ensure spatial connectivity. The clustering methodology does not require a predefined number of clusters but determines this number based purely on the variation in the environmental fields. Technically, the methodology takes a feature affinity (homogeneity) threshold as input to determine if two neighboring grids should be merged to form a larger grid. This affinity threshold (k=0.01), set as a constant for all months, is determined by cross validation, where the threshold that yields the best regression model is selected. This single threshold directly measures the environmental homogeneity and is more subjective than setting arbitrarily the number of clusters. Before clustering, each environmental variable is normalized so that all features are numerically comparable and contribute equally to the cluster identification. As a result, for each month, the entire basin is divided into a set of connected clusters based on local environmental variables. The more homogeneous the environmental fields over the basin, the fewer clusters form in the basin, and the environmental variables are considered homogeneous within each cluster. An example of clustered grids is shown in FIG. 2, in which the entire basin is divided into 16 clustered grids. After clustering, the storm counts and averaged environmental fields over all clustered grids and all months are collected to perform the Poisson regression (Equation 1).

To evaluate the genesis model, 27 years of historical data (1979-2005) are used for model development and the remaining 9 years (2006-2014) of data are left for out-of-sample evaluation. Environmental variables are standardized by subtracting the mean and dividing by standard deviation before fitting the model. The estimated model coefficients are shown in the table in FIG. 3. As expected, PI, RH, and VO are positively correlated to cyclogenesis, while SHR is detrimental to storm formation. The negative intercept indicates that it is very unlikely to have storms generated when all environment variables are at their mean. This result also helps to explain the rareness of TCs, which happen only in favorable rather than mean-state environments.

The performance of the genesis model is evaluated by comparing model simulations with observations. When applying the model to new data (e.g., new monthly environmental variables in 2006-2014 for model testing), the basin needs to be divided into connected clusters. More specifically, to simulate the storms in a specific month, the graph-based segmentation methodology is first used to divide the basin into clusters according to the similarity among local environmental variables for the month. Then, the cluster-averaged environmental variables are computed. Equation 1 is then applied to obtain the monthly Poisson rate for each cluster. Given the count, randomly drawn from the obtained Poisson distribution, the genesis location is drawn uniformly within the cluster and a formation date is selected uniformly during the month, to be consistent with the Poisson theory. Repeating the above processes, TC genesis climatology is simulated in the period of 1979-2014 by constructing 100 independent 36-year realizations.

Figures 3, 4:
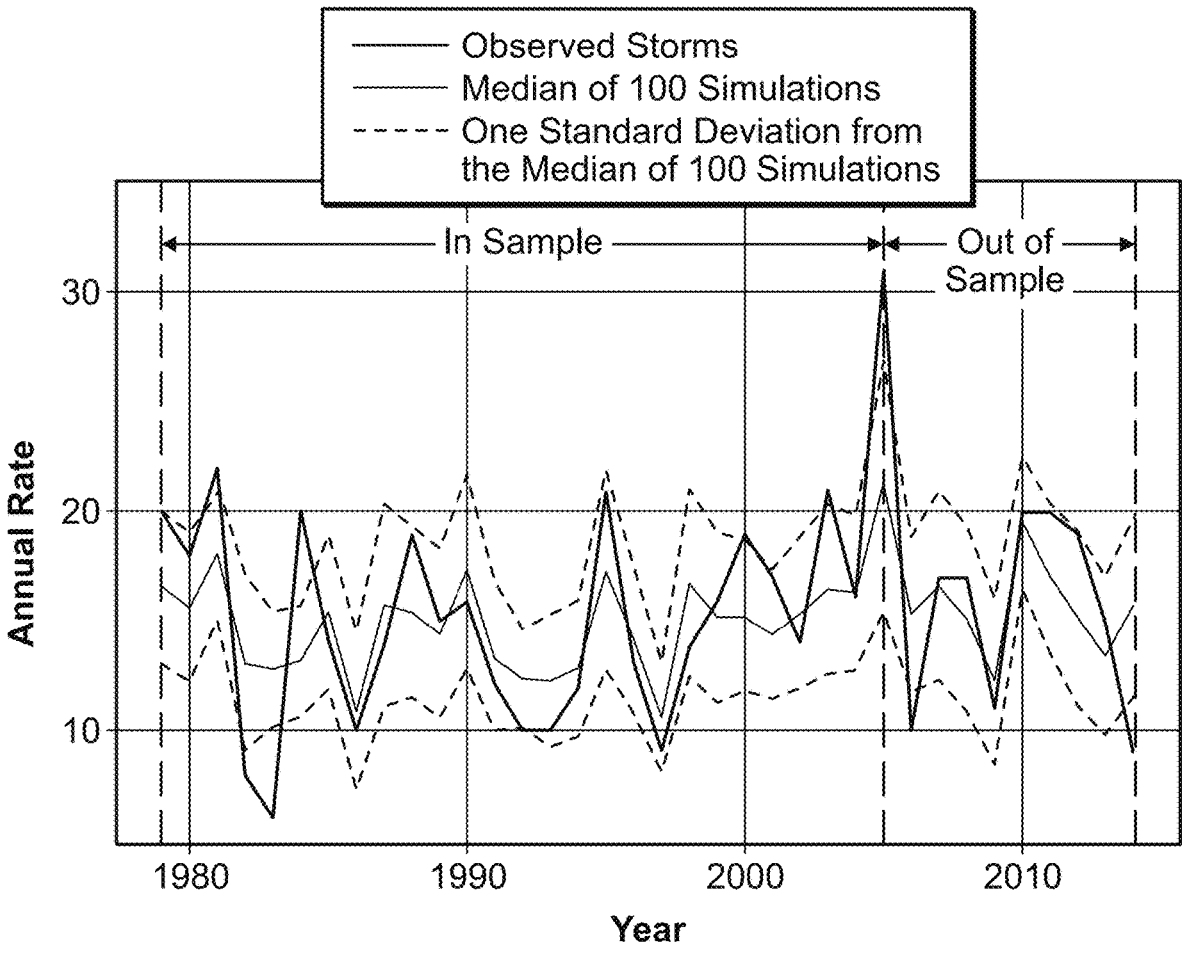
FIG. 3 depicts a table of coefficients of a clustering-based genesis model according to an embodiment of the present invention.
FIG. 4 depicts a comparison of simulated (dotted) and observed (solid) TC annual frequency according to an embodiment of the present invention.
Figure 5:
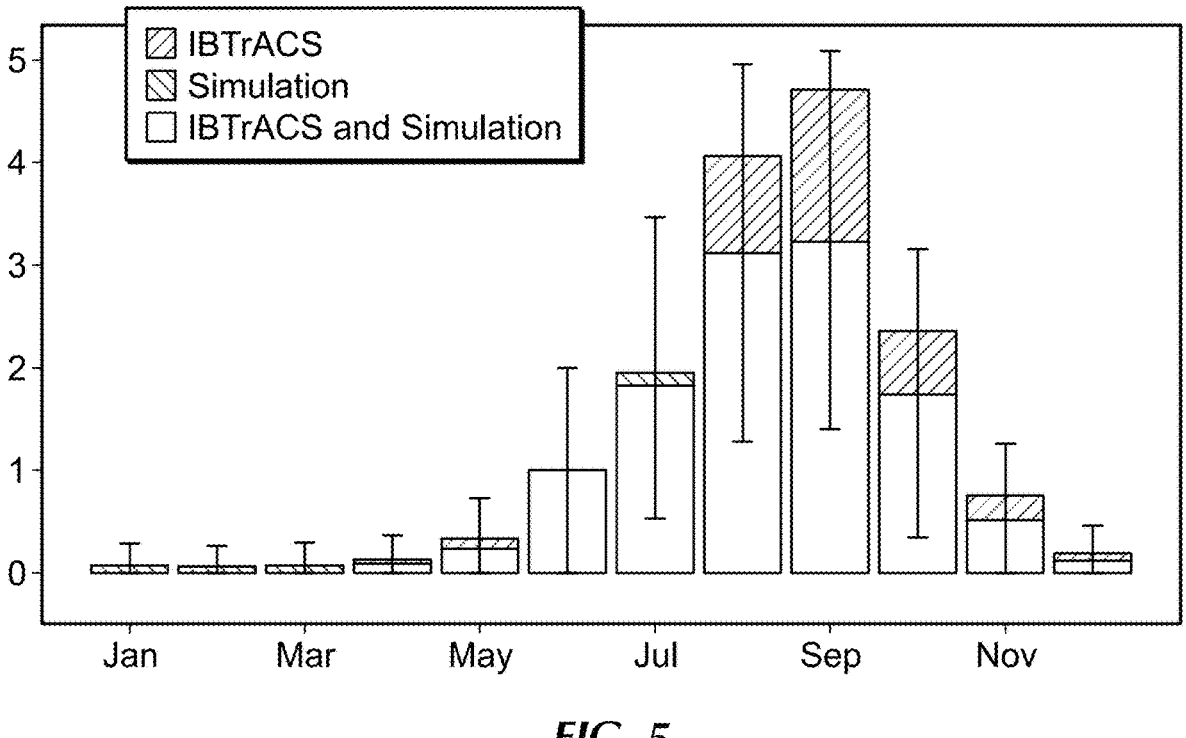
FIG. 5 depicts a comparison of seasonal variation of simulated and observed genesis according to an embodiment of the present invention.

The time series of annual rates of observed and simulated storms over the basin are shown in FIG. 4. The solid thick line represents the observed storms. The solid thin line represents the median of 100 simulations. The dashed thin lines represent one standard deviation from median of the 100 simulations. There are on average 15.51 storms per year generated in the simulation, very close to the historical observation of 15.41 storms per year, over the period of 1979-2014. The correlation coefficient between the observed and simulated (median of the 100 realizations) annual count is relatively high (0.74 on training set and 0.72 on testing set). The genesis model can capture the interannual variation under different ENSO phases, simulating more storms in strong La Nina years (e.g., 1988 and 2010) than in strong El Nino years (e.g., 1982 and 1997). The modeled magnitude of interannual fluctuations is about 14 TCs (the median), smaller than that of 26 TCs in the observation. However, this clustering-based genesis model outperforms the genesis model developed based on regular grids particularly at the interannual scale, as the magnitude of interannual fluctuations is predicted as 8 TCs using regular grids. While the previous GPI and TCGI models were found to have limited ability to reproduce the amplitude of interannual variability, the disclosed genesis model 18 produces a standard deviation of 4.12 for the annual rate, which is very close to that of 4.33 in observation (for both training and testing datasets). For seasonal variability, as shown in FIG. 5 for the monthly storm count, the simulation captures the active and nonactive seasons, although the model slightly overestimates the storm count in unfavorable seasons, especially in July, while it underestimates the storm counts from August to December. Such a relatively weak variability on the seasonal scale of the model is also seen in the GPI and TCGI models.

Figure 6:
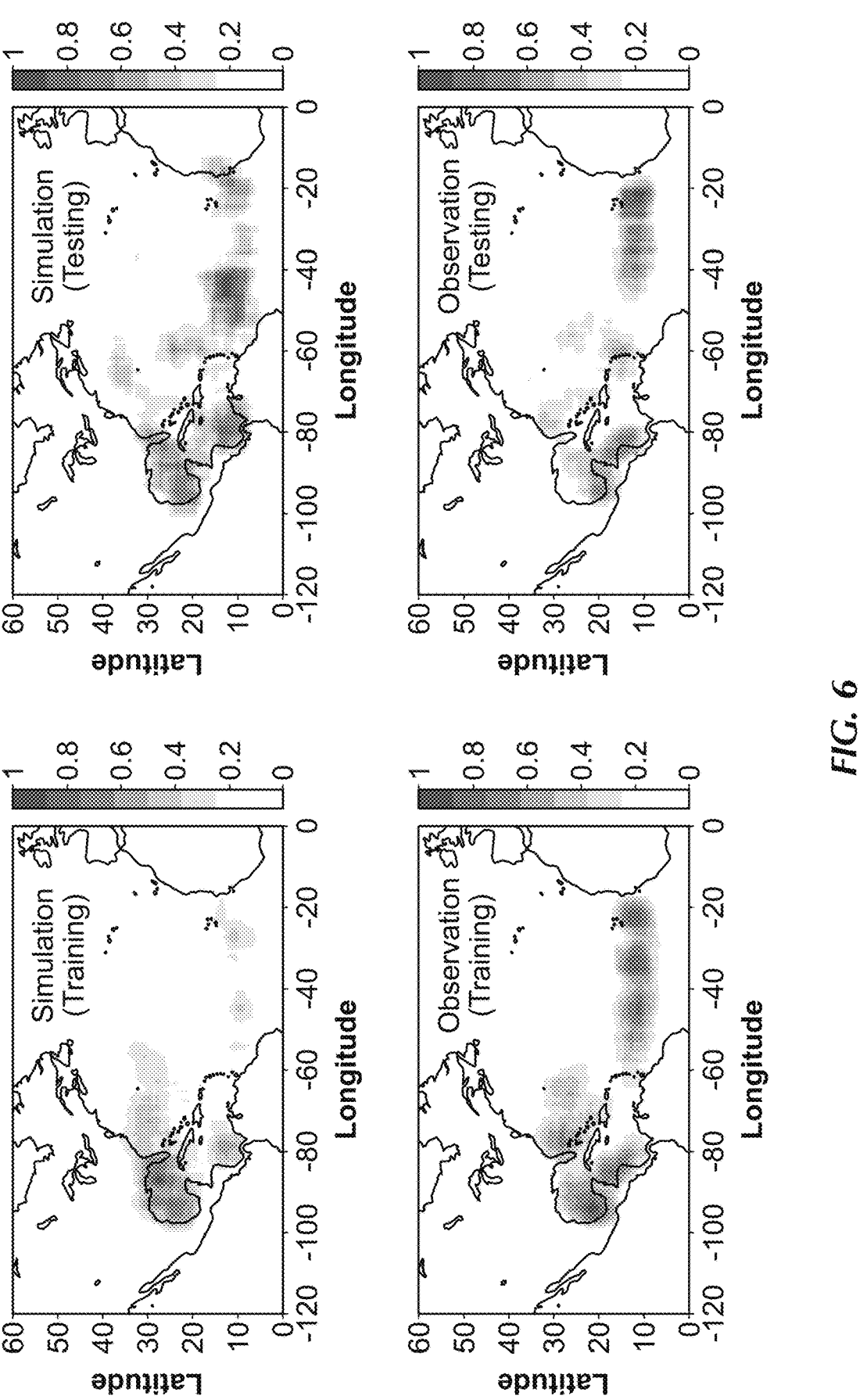
FIG. 6 depicts a comparison of spatial distribution of genesis in simulations and observations in the training dataset and testing dataset according to an embodiment of the present invention.

A comparison of spatial distribution of the genesis in the observation and in one selected simulation is shown in FIG. 6. The local counts are normalized by the maximum grid count over the entire basin. The simulation generally captures the observed spatial pattern and has local maxima in approximately the right locations, although it has lower peak values, especially in the main development region (10° N-20° N, 80° W-20° W). The spatial extension of the simulation is also wider than the observation, with some simulated storms occurring 40° N, which is rarely seen in the observation. The genesis model may predict a nonzero probability of storm formation in a location or month where no TC genesis events have been observed in the history. Similar to results from previous TC index models, the simulated genesis locations are also slightly shifted equatorward, probably because the influence of the Coriolis term on TC genesis is not well represented in the environmental variables (there is no explicit location term in the disclosed model).

Model Components: Track 20

Given the genesis formation, the track model 20 determines the storm's movement and landfall location. In previous studies, the simplest track models propagate storms by resampling translation speed and changes in the direction of movement from historical TCs that are close to the storm's current position. Since storm persistence is shown to be an important predictor, several autoregressive models and their variations have been developed to generate synthetic tracks. Another important category of track models based on TC predictors is hurricane analog models. In one model, historical tracks that meet the requirements of both appearing in the similar region and time of the year and having similar heading and translation speed are selected as analog tracks, to inform the displacement of the current storm. These above-mentioned models rely on historical storm tracks and may perform well under the current climate, but they are unsuitable for track simulation under a changing climate. A beta-advection model coupled with local synthetic wind was developed, under the assumption that storms move with vertical mean advection plus the effect of beta drift. This model was also revised so the constant beta drift was location dependent. While the model works well with synthetic winds, a direct regression of historical track movement on observed winds does not perform well, probably due to the large temporal-spatial variation in local winds. Therefore, here, a new track model 20 is developed that follows the steering wind assumption described above but overcomes the challenge of large local-wind variation by also incorporating analog track patterns.

Here, the track model 20 is developed with predictors based on both similar historical tracks and local winds. However, in contrast to some prior models, where similarity is defined mainly based on storm location and date in the year, here similarity is defined based on only the two-step (12-hr) track shape. Thus, although the model depends on historical tracks (over the entire basin), it does not depend on the storm location. Since TCs are driven mostly by background steering wind, the similarity among TC tracks in return implies similar steering winds. Thus, TCs that share a similar existing trajectory would be more likely to move in a similar pattern in the next step. An analog track model is first developed that depends purely on track analog predictors. Then, in situ winds are incorporated as additional environmental predictors to further improve the model. Intuitively, the analog predictors generated from past track data reflect the mean background steering winds, while the wind predictors govern the variation due to real-time in situ winds.

To generate analog predictors, a track segment pool is first prepared from historical TCs to be used for similarity matching. Full TC tracks are discretized into 6 hourly segments to obtain ~10,000 two-step track segments from 415 observed TCs in the period of 1948-1978. It is to be noted this discretization is exemplary and not intended to be limiting. Then, for each new storm, its current location and previous two locations form a two-step query of track segments. Similar segments are searched in the segment pool based on the Euclidean distance between the vectors, and the best-matching track segments are selected as guidance for propagating the storm in the next step.

Specifically, a random forest regression model is built to map analog track predictors to real storm displacement. The analog track predictors are selected as the mean and standard deviation values of best-matching track segments. Each mean displacement represents a hypothetic movement and its standard deviation is a measurement of the confidence for this hypothetic movement. For example, if the observed next step displacements from 10 best-matching track segments are close to each other, accordingly the standard deviation is small. On the other hand, if the observed next step displacements are quite random, the large standard deviation indicates a low confidence in following the mean pattern. In practice, a series number of best-matching track segments are selected, from the most similar one track segment to the most similar 10% track segments, and the mean and standard deviation values of the series of suggested movements are calculated as the analog predictors. A sensitivity test indicates that the model is not very sensitive to the number of selected best-matching storms, and any selections that can well represent the population of the most similar <10% tracks can be good analog predictors.

In the analog model, only analog predictors are used from the historical data; no direct wind data is included. To account for the impact of real-time in situ winds, an analog-wind model is built by adding meridional and zonal winds at both 850 hPa and 250 hPa levels, as four additional dependent variables in the random forest regression model. It is to be noted the pressure measurements chosen are exemplary and not intended to be limiting.

This analog-wind model improves over previous models in several aspects. First, since in situ real-time winds vary the greatest in space and time among all meteorological variables, this uncertainty is reduced by representing steering winds partially with analog predictors. Second, two-step track segments are selected instead of longer segments to emphasize the effect of the local wind, since storms may not respond to winds earlier than 12 hours before. Lastly, through TC analogs, movement inertia is taken into consideration as it takes time for storms to respond to the winds.

Both the analog track model and the analog-wind model are built on 417 TCs in the period of 1979-2005 and are tested on the 138 TCs in the period of 2006-2014. The results for both training dataset and testing dataset are shown in the table in FIG. 7. The $R^2$ values are between 0.83 and 0.93 for the testing dataset. As a comparison, the $R^2$ for the track model with only the local wind predictors is around 0.6 in both directions. Thus, adding analog predictors improves track model dramatically. In both analog and analog-wind models, the prediction of the movement for the meridional direction is slightly better than that for the zonal direction. Adding in situ wind predictors only slightly increases the statistical $R^2$; however, the wind components are of great importance in controlling the meandering behavior of storms over the ocean, as discussed further below.

To evaluate the track component 20, the track of 555 historical storms during 1979-2014 (initiated from historical locations) are simulated in 40 independent runs and simulated tracks are compared with observational tracks. The first two steps of the track are simulated using only the local wind. Then the analog model and analog-wind model are applied respectively for the rest of the trajectories until the storm center hits land.

Figure 8:
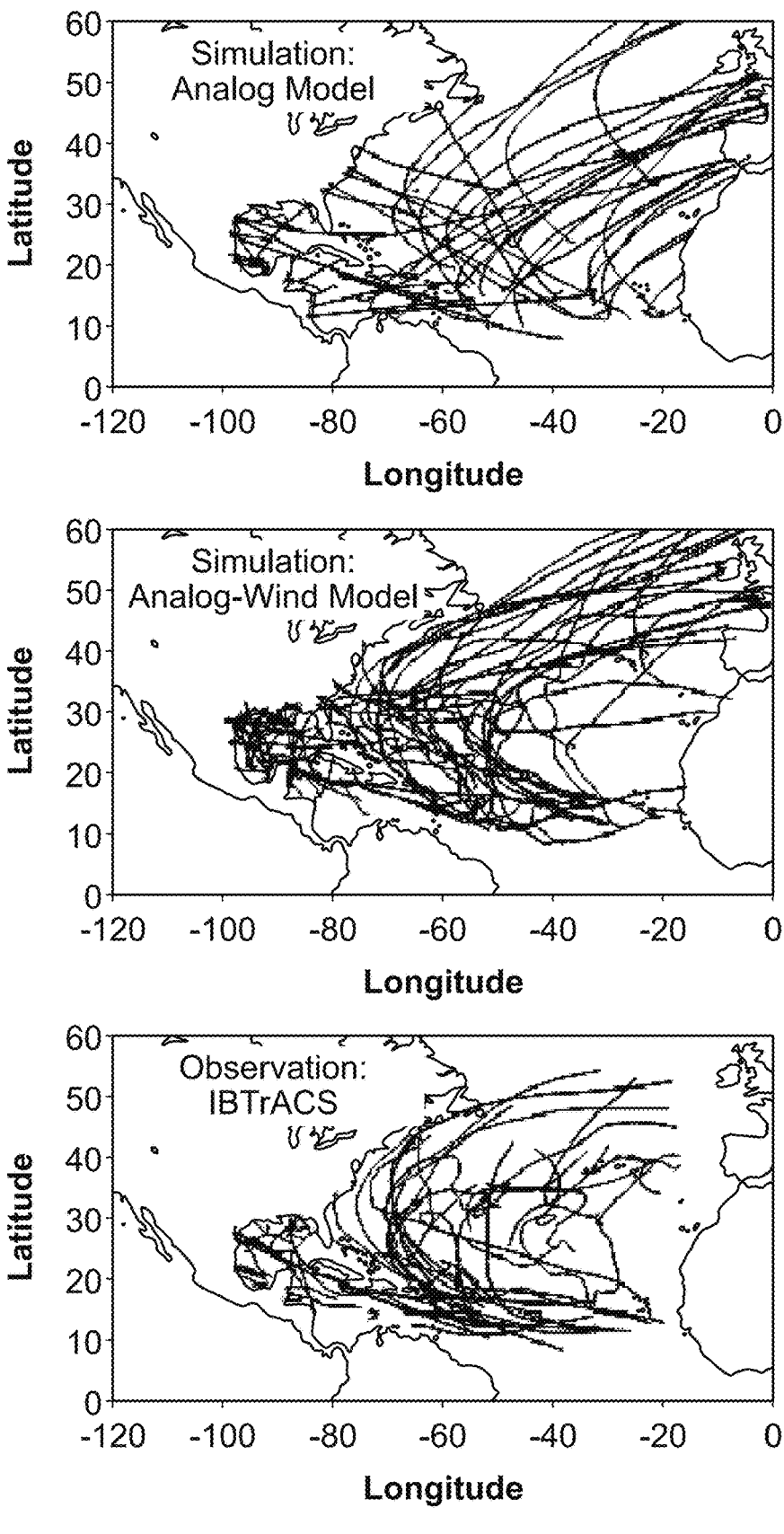
FIG. 8 depicts a graph of sixty randomly selected tracks from an analog track model simulation, an analog-wind track model simulation, and observation according to an embodiment of the present invention.

FIG. 8 shows the comparison of 60 randomly selected tracks generated by the analog track model and analog-wind track model, with the same initial locations in IBTrACS. It is found that although only a slight difference appears between the $R^2$ values of the models, the synthetic tracks from the analog track model are much smoother (with even straight lines) than observations, but this problem is largely resolved in the analog-wind model. In general, the analog-wind model produces more realistic tracks with more tracks executing turnings, meanderings, and crossings. It is noted that the model is relatively robust to initialization; however, it is possible to generate storms that hit South America (where no storm has ever been observed) if the movement in the first two steps is drawn randomly. This observation indicates that the wind-driven initialization is necessary.

Figure 9:
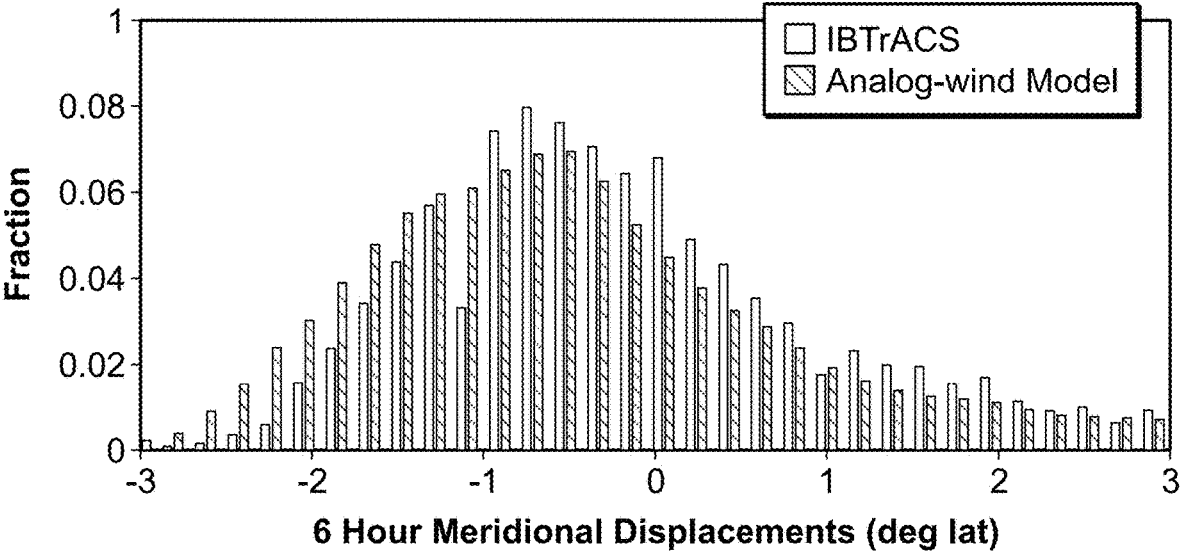
FIG. 9 depicts a comparison of observed and simulated probability density function of 6-hour meridional and zonal displacements of storms in 1979-2014 according to an embodiment of the present invention.
Figure 9:
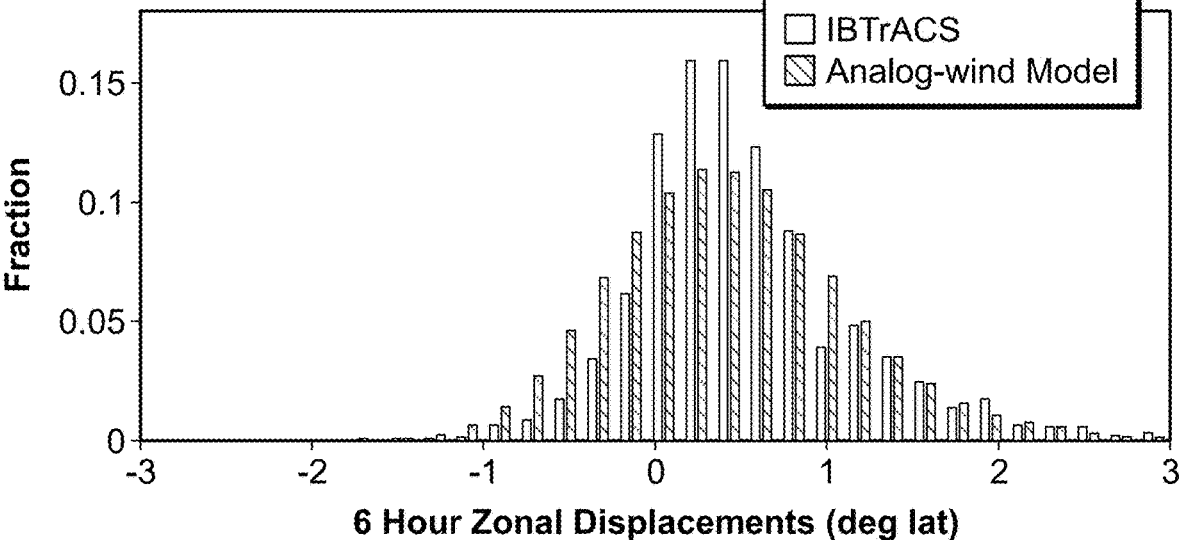

A comparison of the 6-hourly meridional and zonal displacements of simulated and observed tracks is shown in FIG. 9. The simulation results are largely in agreement with observations. There exists a slightly positive bias for the negative meridional displacement, a negative bias for the positive meridional displacement, and an overestimation for negative zonal displacements. These biases may induce less recurvation in simulated storm tracks, as can be seen in the comparison of the track density between simulations and observations, shown in FIG. 10.

Figure 10:
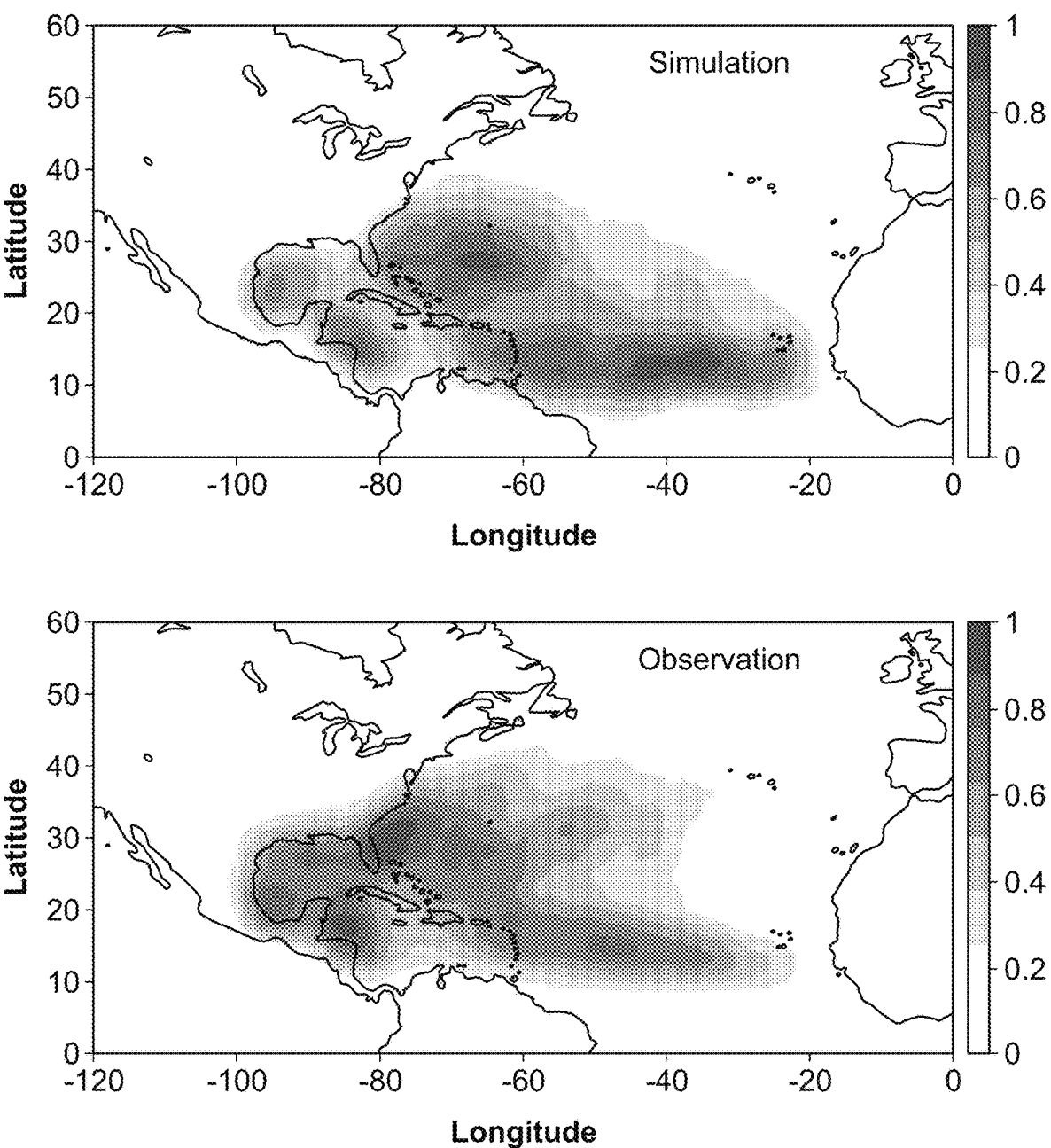
FIG. 10 depicts a comparison of track density from simulation and observation according to an embodiment of the present invention.

In FIG. 10, the grayscale shows the spatial track density normalized by the basin maximum. The simulations capture relatively well the spatial variation of TC tracks in terms of the maxima occurring at the Caribbean Sea, Gulf of Mexico, and U.S. East Coast and near the main development region of TCs. However, the analog-wind model tends to have a negative bias in the magnitude of the local maximum in the Gulf of Mexico. Also, some simulated tracks recurve earlier than historical storms, and the hot spot close to Florida and South Carolina is further off the U.S. coast in the simulation.

Model Components: Intensity 22

Here, a Markov environment-dependent intensity model, MeHiM, is applied to simulate storm intensity evolution. The development of this model is described in previous studies, Lin et al. (2017) "A statistical investigation of the dependence of tropical cyclone intensity change on the surrounding environment", Monthly Weather Review, 145, 2813-2831, and Jing and Lin (2019) "Tropical cyclone intensity evolution modeled as a dependent hidden Markov process", Journal of Climate, 32, 7837-7855, which are herein incorporated by reference in their entireties. The basic structure and advantages of this model will be briefly described below.

The MeHiM is developed to simulate TC intensity evolution dependent on the surrounding large-scale environment. This model 22 considers three unobserved (hidden) discrete states of intensification and associates each state with a probability distribution of intensity change. The three unobserved discrete states, including "static," "moderate," and "extreme" states, represent the storm's slow, normal, and rapid intensity change, respectively. The storm's state varies in each time step, and the storm's transit from one state to another is described as a Markov chain. In addition to the storm variables (i.e., V and DVp), both the intensity change and state transit are dependent on environmental variables including PI, SHR, RH, and OCN. In the simulation, the storm's initial state is initialized by a multinomial logistic regression. Then, MeHiM is used to simulate storm intensity evolution when the storm is over the ocean, and a simplified land model is added to estimate intensity decay, in which the decrease in the intensity when the storm moves over land is modeled as an exponential decay function of time.

As evaluated extensively by Jing and Lin (2019), the MeHiM improves over previous models including linear and mixture models, as it can better simulate rapid intensification (RI) of storms, which are essential in better capturing the tail of the distribution of the life time maximum intensity. The MeHiM provides a "lock-in" mechanism that supports continuous large intensification once the storm enters the extreme state and when the environment is favorable, so that it can simulate a realistic fraction of RI storms, comparable to the observation.

Integrated TC Model PepC 10

The three model components 18, 20, 22 are coupled together to form the TC modeling system, PepC 10. TCs for the NA basin in the period of 1979-2014 are simulated and the results are compared with historical data to evaluate the performance of PepC 10. For each year in the simulation, the hierarchical Poisson genesis model 18 is used to estimate the number of storms and location and time of their formation. Then, each storm is propagated by the analog-wind track model 20. Along the track, the storm's intensity (sustained maximum wind) is initialized by random sampling from the historical data and then simulated with MeHiM 22, until the storm's intensity becomes lower than 10 kt. To account for the uncertainty in a stochastic modeling system, 100 realizations of the 36-year simulation (1979-2014) are conducted. A total of 55,117 tropical storm seeds are obtained, and among the seeds, there are around 66%±2% that can intensify and reach TC strength (LMI>34 kt; 36,311 storms in total). To form a fair comparison with IBTrACS, storms with LMI less than 25 kt are removed, and the remaining 43,979 storms are used for evaluation.

Genesis Density and ENSO States

After removing tropical storm seeds that cannot grow to 25 kt, the spatial distribution of the remaining genesis is similar to that initiated by the genesis component, as shown in FIG. 6. This similarity indicates that coupling the track and intensity components 20, 22 with the genesis component 18 do not largely change the spatial distribution of the genesis. A large negative bias still exists in the main development region, which has a significant impact on simulated TC track density in that region, as will be discussed below.

Figure 11:
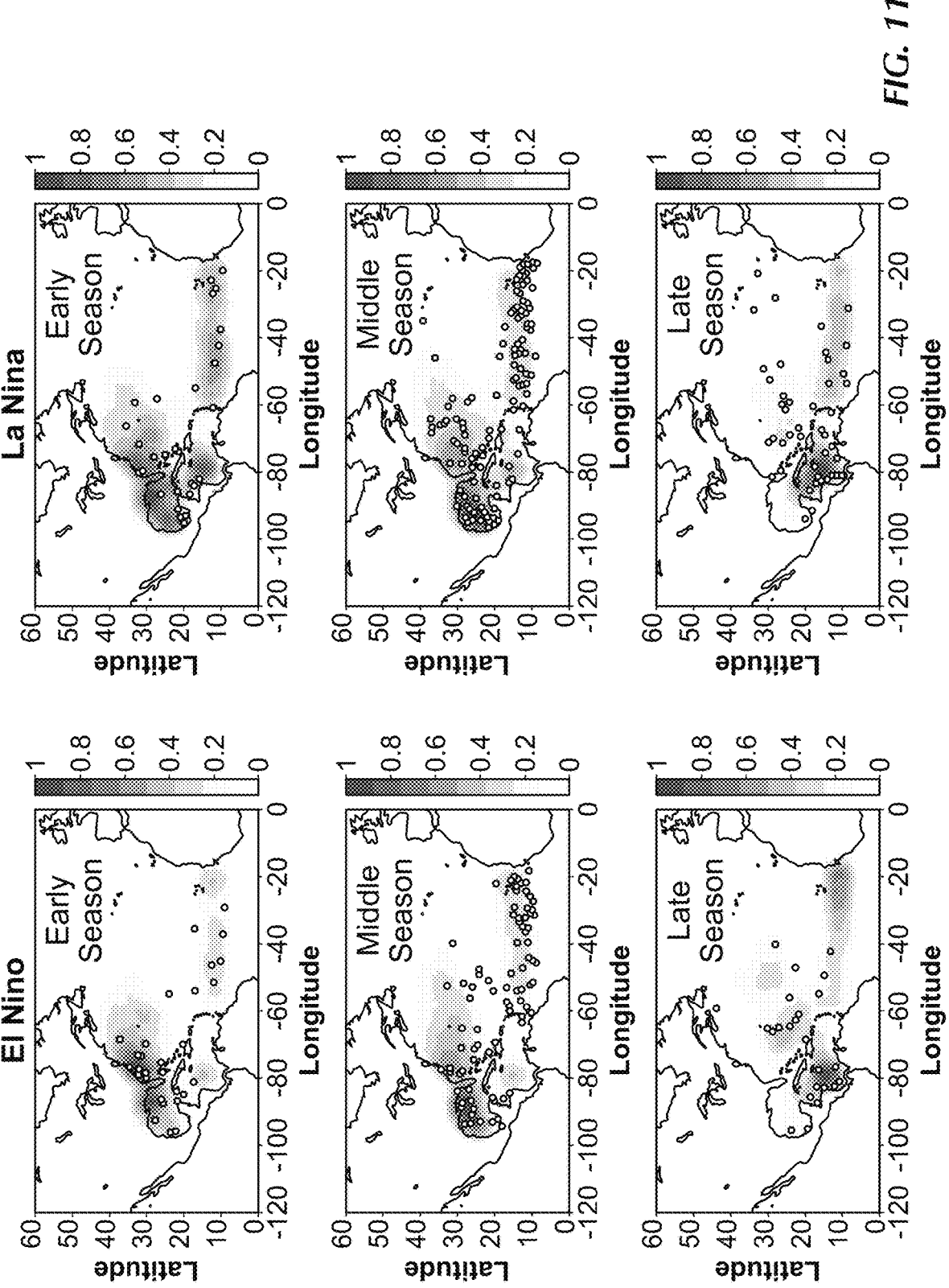
FIG. 11 depicts a comparison of observed and simulated TC genesis in El Nino years and La Nina years moving from early season to middle season to late season according to an embodiment of the present invention.

As ENSO is a major driver of TC interannual variations, the phase variability linked to ENSO is further examined, especially the shift in genesis location under different ENSO states. Simulations for strong or very strong El Nino years (1982-1983, 1987-1988, 1991-1992, 1997-1998) and La Nina years (1988-1989, 1998-2000, 2007-2008, 2010-2011) are compared in FIG. 11. In addition to a decrease in the TC rate from El Nino years to La Nina years, different shifts in the genesis location also exist in the two contrasting ENSO phases. TC genesis tends to move away from the Gulf of Mexico in the early season to the Caribbean Sea in the late season during El Nino years. However, in La Nina years, the genesis locations are found off the southeast U.S. coast early in the season, moving toward the Gulf of Mexico in the middle season, and shifting equator-ward over the Caribbean Sea in the late season. On average, TCs tend to form in lower latitudes during La Nina years compared to El Nino years. These historical features are captured by the probabilistic TC model here although the model does not directly depend on ENSO indices.

Track Density and Landfall Frequency

Figure 12:
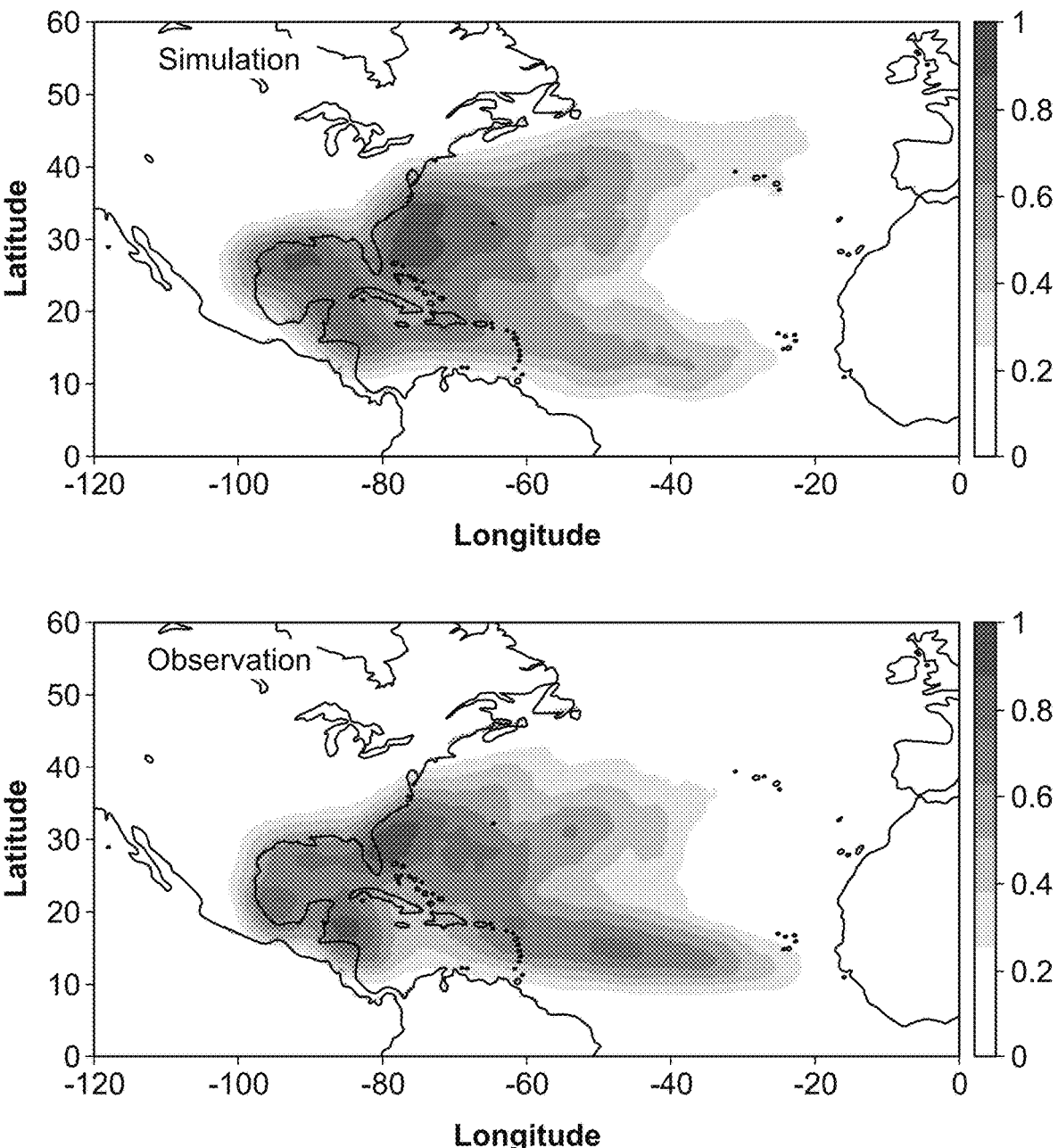
FIG. 12 depicts a comparison of simulated track density and observed track density according to an embodiment of the present invention.

Simulated and observed track density is compared in FIG. 12. As a land model has been applied to simulate intensity decay over land, observed full tracks are used in this comparison (rather than only the parts over the ocean as shown in FIG. 10). Simulations compare relatively well with observations, with the simulated tracks mimicking the typical recurving pattern in observed tracks. However, the area of peak density close to the U.S. coast is larger in the simulation, and the peak density extends farther into the Gulf of Mexico. On the other hand, the large negative bias in the main development region still exist, and it is mostly due to the negative bias in this region of the genesis model.

Figure 13:
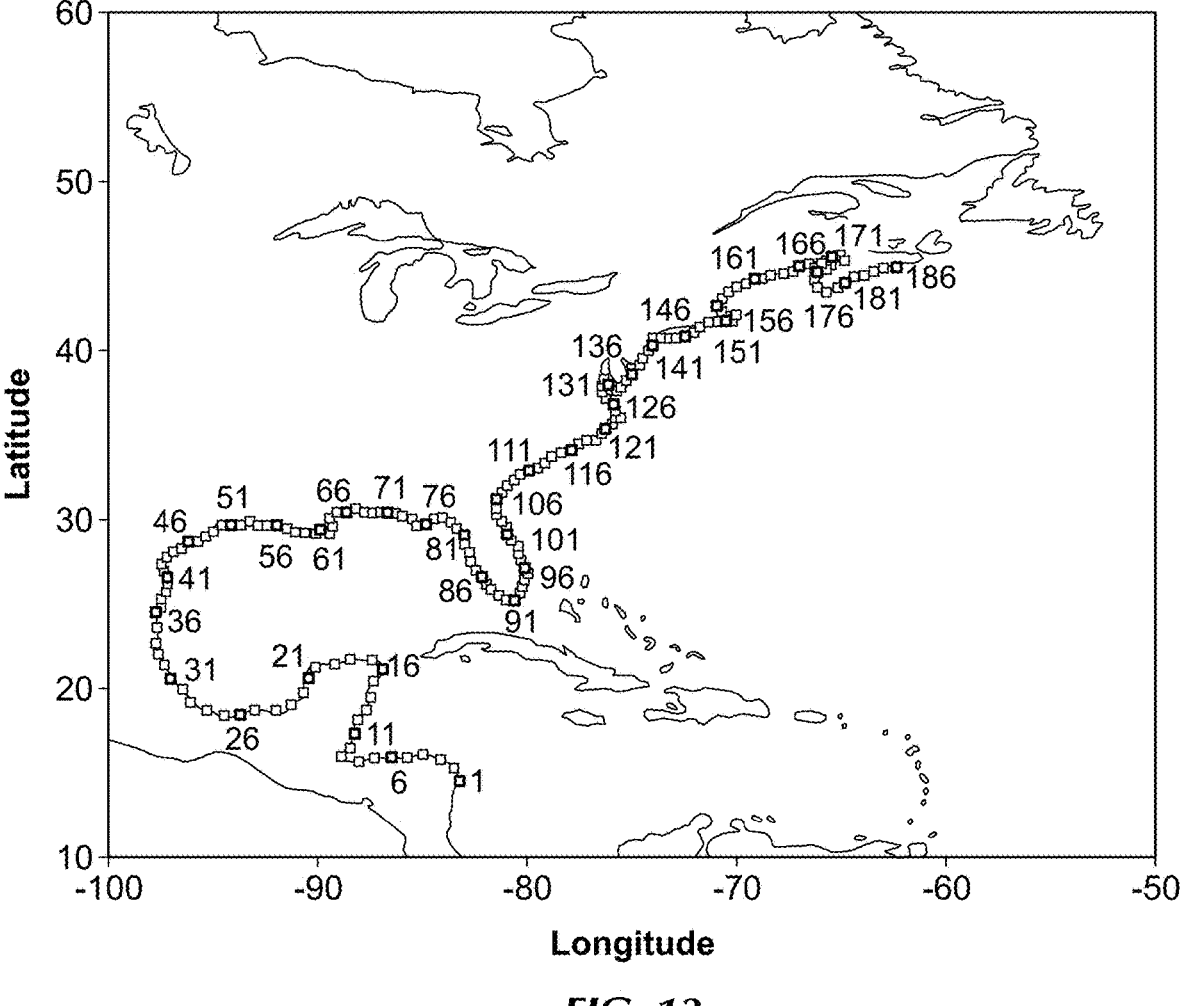
FIG. 13 depicts a graph of locations of considered mileposts along the Mexico and United State coastline according to an embodiment of the present invention.
Figure 14:
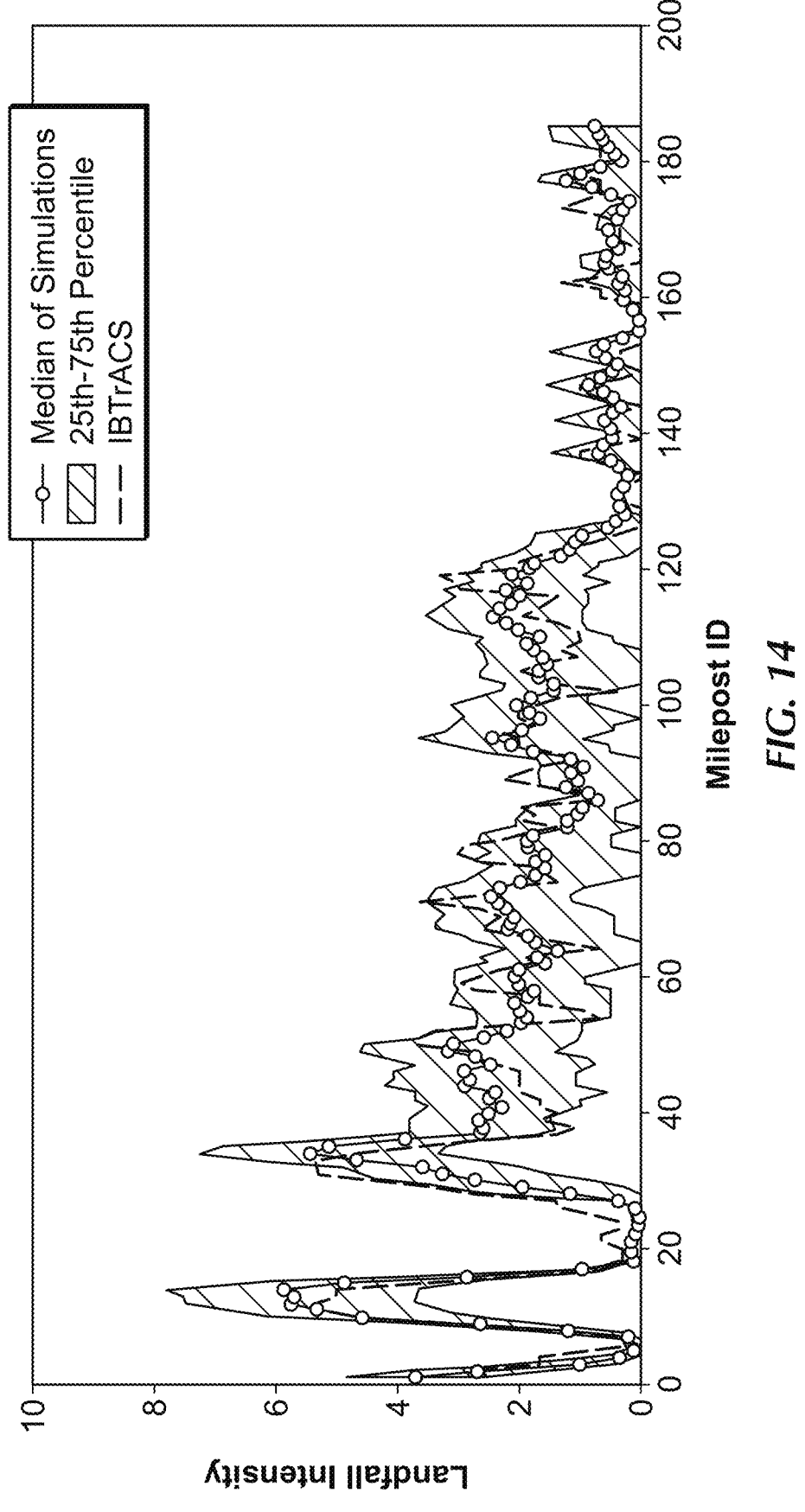
FIG. 14 depicts an observed and simulated landfall frequency at each of the mileposts along the North Atlantic coastline according to an embodiment of the present invention.

Regional annual landfall frequency is further examined at coastal locations along the NA coastline. To help indicate locations, a total of 186 mileposts (MPs) are defined, as shown in FIG. 13, to cover the coastline with 100-km spacing along the Mexican coastline and 50-km spacing along the U.S. coastline. As shown in FIG. 14, the simulated landfall frequency is in good agreement with observations for almost all mileposts. A slight negative bias exists in the coastal regions near MP 21-31 (lower Gulf of Mexico) and MP 76-91 (west Florida coast), where the observed frequency is near or beyond the upper-75th-percentile bound of the simulated spread. There is also slight positive bias around MP 36-45 (Gulf of Mexico, near the border of United States and Mexico). These biases also appear in the track density plot in FIG. 12. However, even though denser tracks are seen in the Caribbean in the observation, the analog-wind model estimates the landfall frequency well for this region (MP 10-13), as landfall is defined as a crossing of the track and coastline segment and many historical tracks passing this region did not hit land. Another interesting result is, though simulated tracks recurve earlier than observations, the landfall frequency is not affected much except for missing the peak around MP 117-120 (near the border of South Carolina and North Carolina), where some historical recurving storms did make landfall. The landfall frequencies for MPs>125 (Ocean, MA) are in good agreement with observations, except for a slight underestimation near MP 162 and MP 175 (near Portland, ME).

LMI and Landfall Intensity

Figure 15:
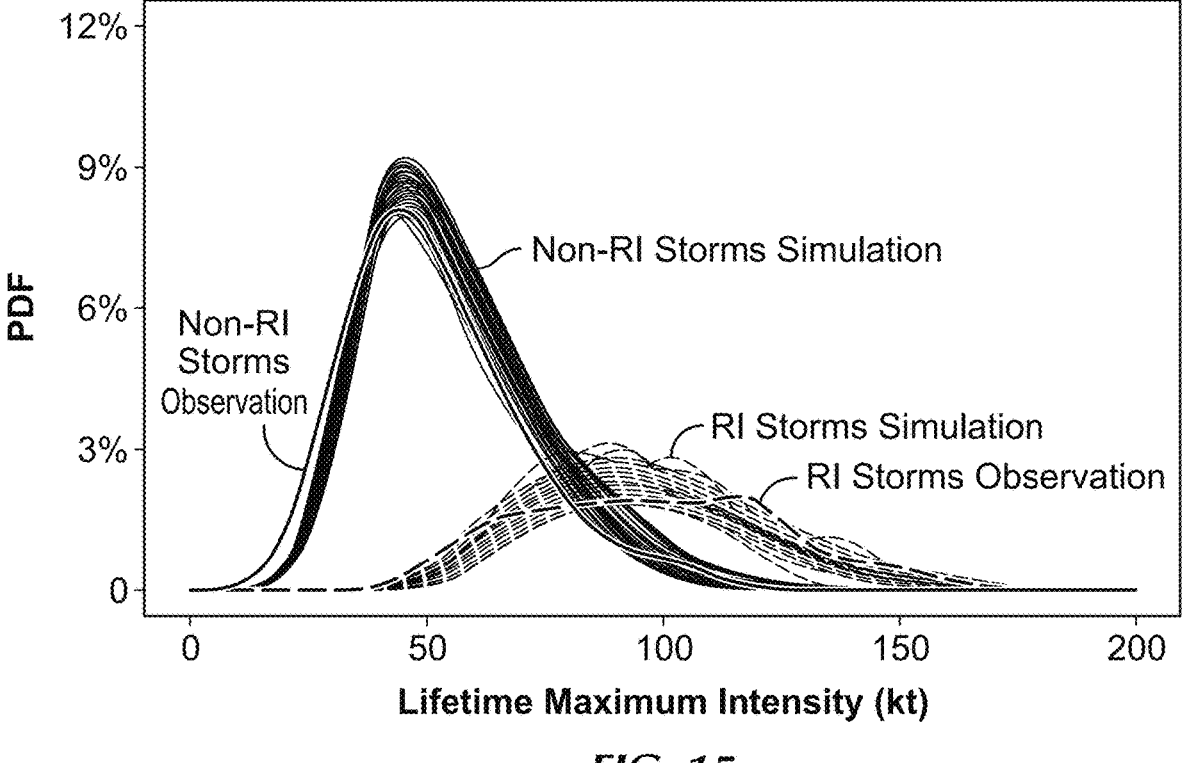
FIG. 15 depicts a probability density function of lifetime maximum intensity from historical record and from 100 model simulations according to an embodiment of the present invention.

Next, the intensity of simulated storms is evaluated. Based on the Saffir-Simpson hurricane wind scale, there are 14.1±1.6%, 6.4±1.1%, 5.1±1.0%, 3.2±0.9%, and 0.9±0.4% Category 1-5 hurricanes, respectively, in the simulation, compared to 14.1%, 5.6%, 6.3%, 6.1%, and 2.2% in the observation. The TC model 10 here generates a realistic fraction of Cat 1-3 hurricanes, though it underestimates the fraction of Cat 4-5 hurricanes by around 50%. In FIG. 15, the LMI distribution for non-RI and RI storms is further examined separately. Among all storms, there are 21.5%±1.8% storms undergoing RI in the simulation, which is close to the observation of 24.9% RI storms. The TC model 10 captures the LMI distribution for both subsets of storms relatively well. A slight shift to larger LMI values exists for non-RI storms in the simulation, which is probably because in MeHiM storms still have a chance to grow and intensify even in moderate environments, while in reality these storms are more likely to stay weak. As for RI storms, the simulated density peak of LMI is about 15 kt underestimated, leading to the underestimation of the most extreme storms, i.e., Cat 4-5 storms. This negative bias in simulating Cat 4-5 hurricanes may come from the limitation of the MeHiM, as discussed in Jing and Lin (2019). It may also come from the bias in genesis and track components. For example, the negative bias of cyclogenesis in the main development region and the positive bias near the coast may result in more TCs with shorter lifespan and less chance for RI toward Cat 4-5 intensities.

Figure 16:
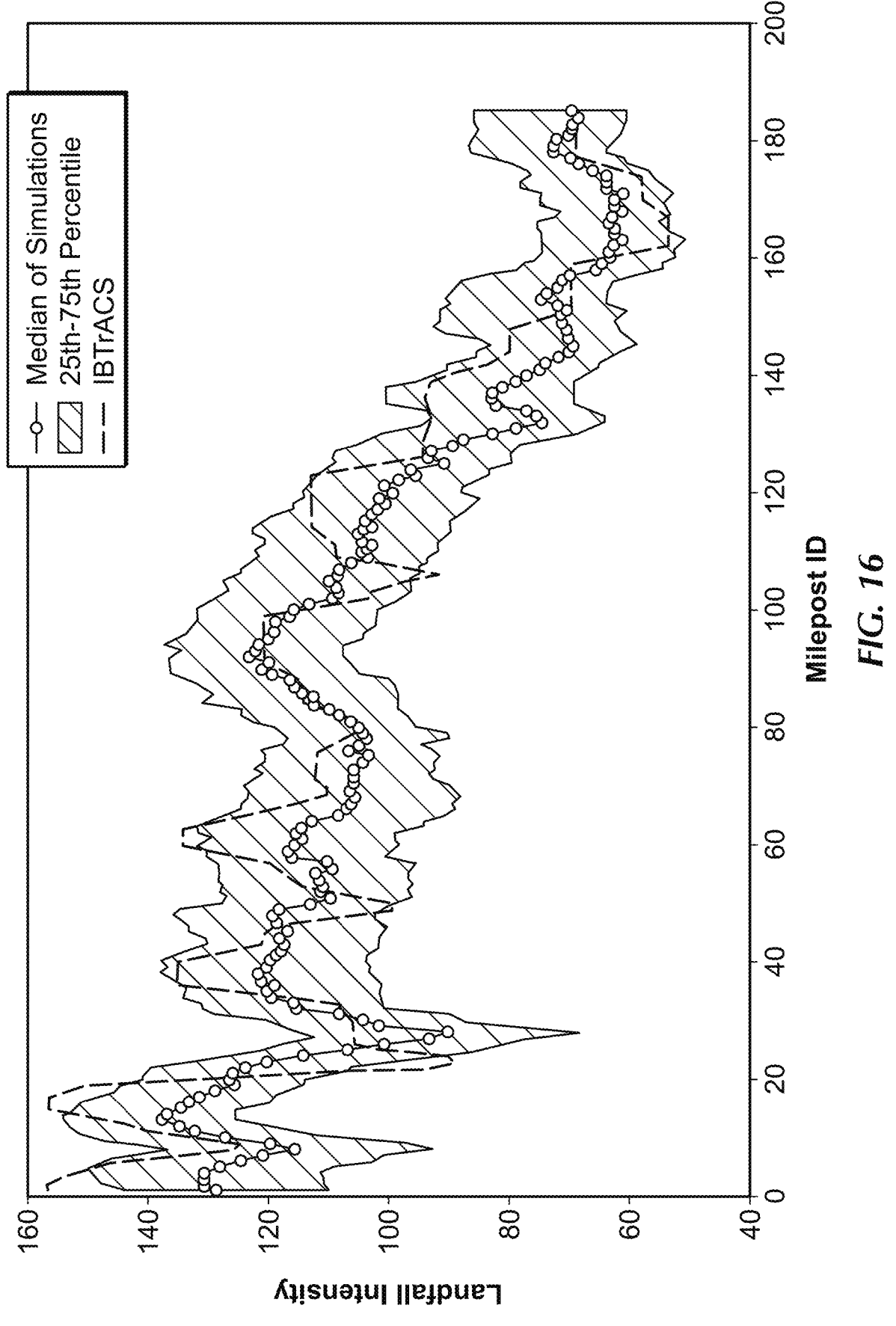
FIG. 16 depicts observed and simulated maximum landfall intensity at the mileposts along the North Atlantic coastline according to an embodiment of the present invention.

FIG. 16 shows a comparison of observed and simulated maximum landfall intensity along the NA coastline. The maximum intensity is defined as the maximum wind speed of all simulated or observed storms that approach within 250 km of each coastal milepost shown in FIG. 13. The median of all the 100 simulations is very close to the observations especially in the north of MP 80 (the U.S. coast), and the range of 25th-75th percentiles can mostly cover the observations. The maximum landfall intensity is underestimated in the Caribbean and the Gulf of Mexico (MP<20), likely due to the fact that the MeHiM has a negative bias in simulating the most extreme storms, which often occur in these regions.

Return Period

Figure 17:
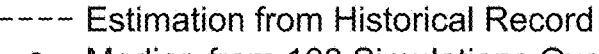
FIG. 17 depicts a comparison of observed and simulated return period curves of landfall intensity in the North Atlantic coastline, Northeast United States, Southeast United States, and Gulf Coast of Mexico according to an embodiment of the present invention.

To discuss about TC hazard potential on regional scales, the NA coastline is divided into three subregions (North-East United States, South-East United States, and Gulf Coast of Mexico) and the return periods of landfall intensities are calculated for the entire NA coastline and for each subregion, as shown in FIG. 17. In all four regions, the historic and simulated return period curves compare quite well. As expected, the Gulf of Mexico region has the greatest hazard potential, with the 100-yr landfall intensity greater than 130 kt, in both the observation and simulation.

Figure 18:
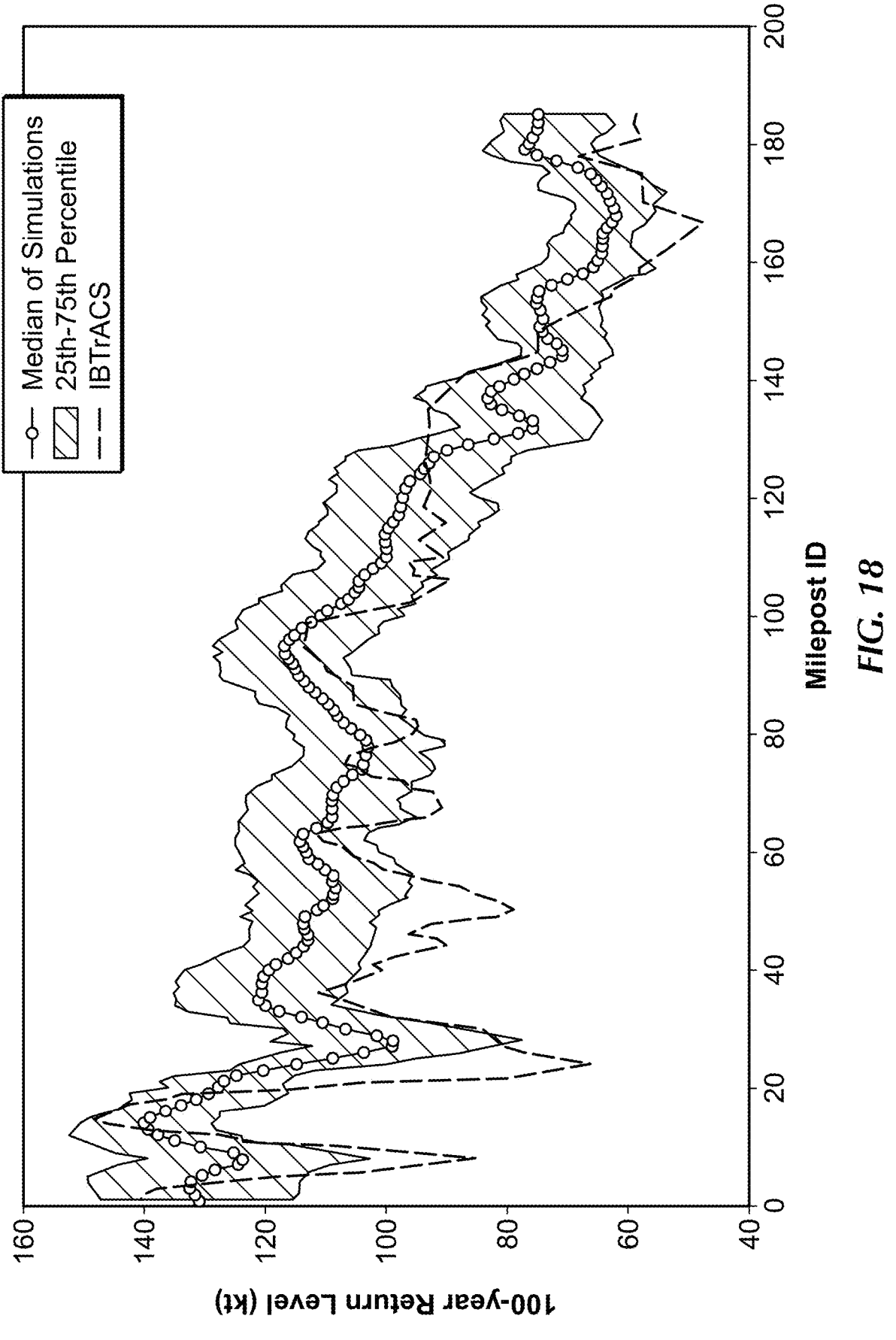
FIG. 18 depicts a comparison of simulated and observed 100-year landfall intensity at the mileposts along the North Atlantic coastline according to an embodiment of the present invention.

To display the local hazard potential, FIG. 18 shows the 100-year return level of the landfall intensity for each of the 186 MPs along the NA coastline. In this plot, all simulated tracks that approach the coastline and are within 250 km of each milepost are used to compute return level for that milepost. The simulation results compare relatively well with observations. The model tends to overestimate the 100-year intensity level along the coastline of Gulf of Mexico, that is, MP 20-100. This positive bias in the return level is induced by an overestimation in simulated track counts in this region. Although the simulation has a similar number of storms crossing the coastline in this region (FIG. 14), more simulated tracks pass within 250 km of the mileposts in the region (FIG. 12).

Humidity Variables

The TC modeling system 10 is dependent on ambient environmental variables including relative humidity (RH) in both genesis and intensity components 18, 22. Some previous studies have suggested using the saturation deficit, rather than RH, to represent the dependence of TC genesis on humidity, for both theoretical and modeling considerations. Saturation deficit (SD) can be defined as:

$$SD = \frac{S_b - S_m}{S_0^* - S_b} \qquad (2)$$

where, $S_m$ and $S_b$ are the entropies of the middle troposphere and boundary layer, respectively, and $S_0^*$ is the saturation entropy of the sea surface. This thermal parameter regulates the time scale of an initial disturbance to moisten the middle troposphere so that intensification can occur, and thus, it may play an important role in regulating TC genesis and thus storm frequency.

Though the seasonal and spatial variations in $S_b$–$S_m$ are dominated by RH under the current climate, this is not the case under global warming. Different choices between RH and SD may even yield conflicting results in simulating TC frequency in a warmer climate. For example, in a recent study, by statistically downscaling six models, an increasing trend was obtained in projected annual mean TC frequency using RH as the humidity predictor and a decreasing trend was obtained using SD under Representative Concentration Pathway (RCP) 8.5 scenario. However, by statistical-deterministically downscaling six models for the RCP 8.5 scenario, this study obtained an increasing trend using GPI based on SD.

Figure 19:
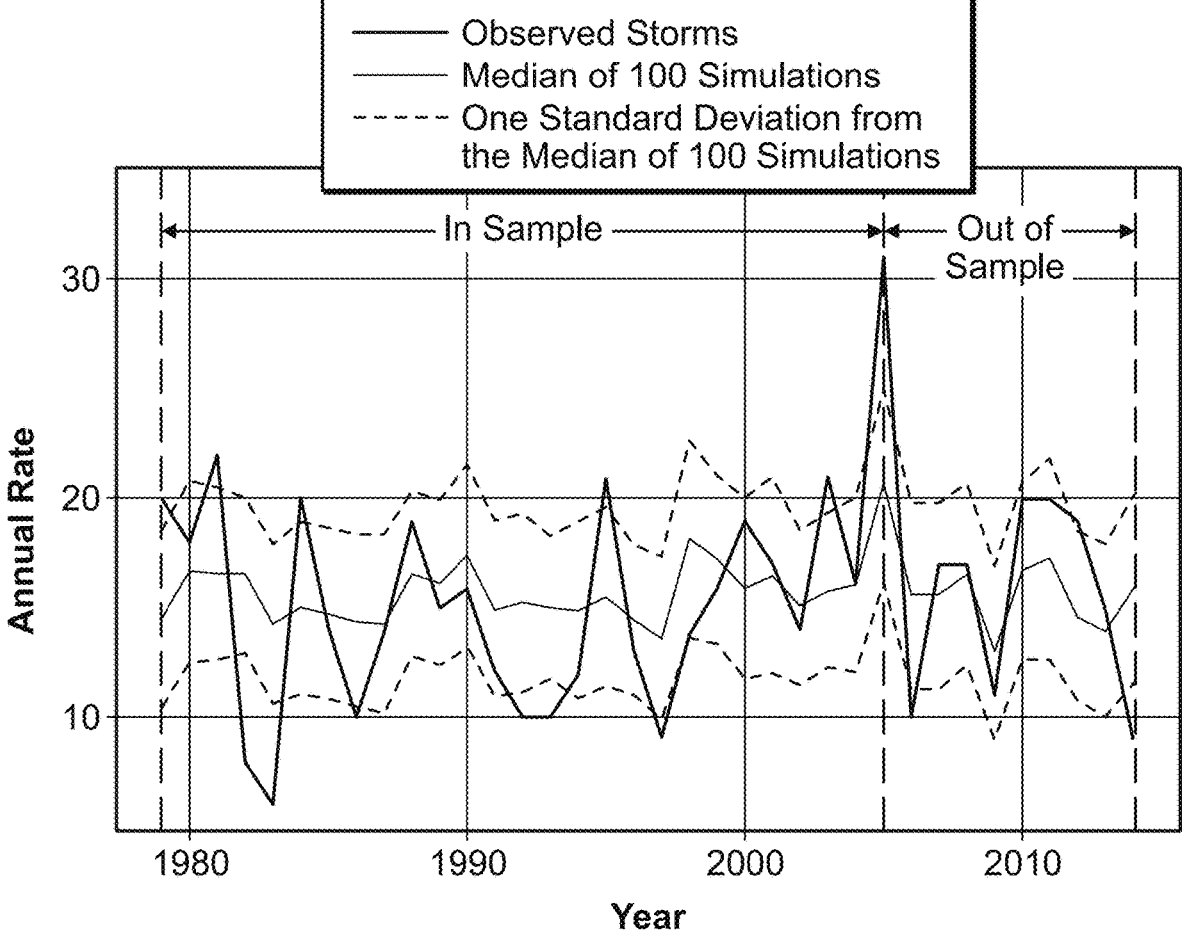
FIG. 19 depicts a comparison of simulated and observed TC annual frequency developed based on saturation deficit rather than relative humidity according to an embodiment of the present invention.

To evaluate if SD performs better in TC statistical modeling for the current climate, an alternative TC genesis model was developed using SD in replacement of RH. The simulated annual rates are shown in FIG. 19. Simulated TC annual frequency using SD has a correlation of 0.57 with the observation (on testing dataset), compared to a correlation of 0.72 using RH. The correlation using RH is significantly higher than that using SD, with a p value less than 0.02. A comparison between FIGS. 4 and 19 also shows that the model using SD is not as good as the one using RH in simulating the peak values in historical TC frequency. Although SD is preferred over RH for climate change studies given its theoretical basis, for the current climate simulations, this model uses RH as it is simpler and renders better simulation results.

CONCLUSION

As such, generally disclosed herein are embodiments for an environment-dependent probabilistic TC model, PepC, to simulate synthetic TCs for risk analysis. PepC includes three model components: a hierarchical Poisson genesis model, an analog-wind track model, and a Markov intensity model, which are integrated to simulate storm's complete lifecycle, from genesis to lysis. The hierarchical Poisson genesis model simulates TC temporal and spatial variations using Poisson regression on clustered grids, where the basin is divided into connected regions such that the environmental conditions are similar within each region. The analog-wind track model is developed based on the BAM assumption but improved by incorporating storm analog predictors that represent effects of both storm's inertia and background winds. The intensity model, MeHiM simulates the storm's intensity evolution using a dependent hidden Markov model, where the storm is assumed to transit among three unobserved states that represent the storm's slow, moderate, and rapid intensity change. The three model components are dependent on local climate variables including absolute vorticity, relative humidity, potential intensity, vertical shear, local winds, and an ocean feedback parameter, which may be taken from either reanalysis data or climate model estimations.

PepC has been evaluated by comparing simulated TC climatology with observations, in the period of 1979-2014 for the NA basin. Simulated TC formations are in good agreement with observations in multiple aspects of climatology statistics including cyclogenesis interannual variation. The differences in TC formation locations under different ENSO phases are also captured. However, there exists a negative bias in simulated TC genesis in the main development region, which leads to a noticeable negative bias in simulated track density near this region. Nevertheless, the bias over this region has relatively little impact on the landfall frequency. Coupled with the hierarchical Poisson genesis model and analog-wind track model, the MeHiM can simulate a similar RI rate as in the observation. While the LMI distribution of simulated storms is in good agreement with observations, including the tail, PepC slightly underestimates the most extreme storms, that is, Cat 4-5 hurricanes. PepC was further evaluated in terms of estimating regional and local TC hazard potential. The comparison between observations and simulations shows that the model performs well in reproducing landfall frequency, landfall intensity distribution, and return periods of landfall intensities. Therefore, PepC can be used to support TC risk assessment for coastal regions, including those with limited observational data.

It is understood that the above-described embodiments are only illustrative of the application of the principles of the present invention. The present invention may be embodied in other specific forms without departing from its spirit or essential characteristics. All changes that come within the meaning and range of equivalency of the claims are to be embraced within their scope. Thus, while the present invention has been fully described above with particularity and detail in connection with what is presently deemed to be the most practical and preferred embodiment of the invention, it will be apparent to those of ordinary skill in the art that numerous modifications may be made without departing from the principles and concepts of the invention as set forth in the claims.

What is claimed is:

1. A machine-learning based system for simulating tropical cyclones (TCs) and assessing TC risk, comprising:
a subsystem configured to generate a plurality of synthetic TCs, from genesis to lysis over an entire basin, the subsystem comprising:
a hierarchical Poisson genesis module configured to develop a Poisson regression and TC genesis simulation on a plurality of clustering grids;
an analog-wind track module configured to determine a current in situ wind and determine movement of a TC by both analog predictors formed by historical track patterns and current in situ wind; and
a Markov intensity module configured to determine intensity change of the TC by considering three hidden discrete states of storm intensity change and associating each state with a probability distribution of intensity change; and
a subsystem configured to receive the plurality of synthetic TCs and assess hazards or risks of the plurality of synthetic TCs.

2. The system of claim 1, wherein the TC genesis simulation is log-linearly dependent on a plurality of climate variables based on the Poisson regression.

3. The system of claim 2, wherein the climate variables comprise potential intensity, relative humidity, wind shear, and absolute vorticity.

4. The system of claim 1, wherein the clustering grids are formed based on similarity of environmental fields.

5. The system of claim 1, wherein the track module is configured with a random forest regression model to map analog track predictors to real storm displacement.

6. The system of claim 1, wherein the current in situ wind comprises meridional and zonal wind variables.

7. The system of claim 1, wherein the three hidden discrete states of storm intensity change comprise static, moderate, and extreme states, representing slow, normal, and rapid intensity change, respectively.

8. The system of claim 1, wherein the intensity change of the TC is determined based on potential intensity, relative humidity, wind shear, and an ocean feedback parameter.

9. The system of claim 1, wherein the intensity module further comprises a land decay module configured to estimate influence of land after the TC makes landfall.

10. A machine-learning based method for simulating TCs and assessing TC risk, comprising:
generating a plurality of synthetic TCs, from genesis to lysis over an entire basin, by:
estimating a location and time of storm formation via a genesis module, the genesis module configured to develop a Poisson regression and TC genesis simulation on a plurality of clustering grids;
determining a current in situ wind;
estimating movement of the storm via a track module, the track module configured to determine movement of a TC by both analog predictors formed by historical track patterns and current in situ wind; and
estimating change of intensity of the TC via an intensity module, the intensity module configured to determine intensity change of the TC by considering three hidden discrete states of storm intensity change and associating each state with a probability distribution of intensity change; and assessing hazards or risks of the plurality of synthetic TCs.

11. The method of claim 10, wherein the TC genesis simulation is log-linearly dependent on a plurality of climate variables based on the Poisson regression.

12. The method of claim 11, wherein the climate variables comprise potential intensity, relative humidity, wind shear, and absolute vorticity.

13. The method of claim 10, wherein the clustering grids are formed based on similarity of environmental fields.

14. The method of claim 10, wherein the track module is configured with a random forest regression model to map analog track predictors to real storm displacement.

15. The method of claim 10, wherein the current in situ wind comprises meridional and zonal wind variables.

16. The method of claim 10, wherein the three hidden discrete states of storm intensity change comprise static, moderate, and extreme states, representing slow, normal, and rapid intensity change, respectively.

17. The method of claim 10, wherein the intensity change of the TC is determined based on potential intensity, relative humidity, wind shear, and an ocean feedback parameter.

18. The method of claim 10, wherein the intensity module further comprises a land decay module configured to estimate influence of land after the TC makes landfall.

19. A non-transitory computer-readable medium having stored thereon a computer program for execution by a processor configured to perform a machine-learning based method for simulating TCs and assessing TC risk, the method comprising:
generating a plurality of synthetic TCs, from genesis to lysis over an entire basin, by:
estimating a location and time of storm formation via a genesis module, the genesis module configured to develop a Poisson regression and TC genesis simulation on a plurality of clustering grids;
determining a current in situ wind;
estimating movement of the storm via a track module, the track module configured to determine movement of a TC by both analog predictors formed by historical track patterns and current in situ wind; and
estimating change of intensity of the TC via an intensity module, the intensity module configured to determine intensity change of the TC by considering three hidden discrete states of storm intensity change and associating each state with a probability distribution of intensity change; and
assessing hazards or risks of the plurality of synthetic TCs.

20. The non-transitory computer-readable medium of claim 19, wherein the TC genesis simulation is log-linearly dependent on a plurality of climate variables based on the Poisson regression.

21. The non-transitory computer-readable medium of claim 20, wherein the climate variables comprise potential intensity, relative humidity, wind shear, and absolute vorticity.

22. The non-transitory computer-readable medium of claim 19, wherein the clustering grids are formed based on similarity of environmental fields.

23. The non-transitory computer-readable medium of claim 19, wherein the track module is configured with a random forest regression model to map analog track predictors to real storm displacement.

24. The non-transitory computer-readable medium of claim 19, wherein the current in situ wind comprises meridional and zonal wind variables.

25. The non-transitory computer-readable medium of claim 19, wherein the three hidden discrete states of storm intensity change comprise static, moderate, and extreme states, representing slow, normal, and rapid intensity change, respectively.

26. The non-transitory computer-readable medium of claim 19, wherein the intensity change of the TC is determined based on potential intensity, relative humidity, wind shear, and an ocean feedback parameter.

27. The non-transitory computer-readable medium of claim 19, wherein the intensity module further comprises a land decay module configured to estimate influence of land after the TC makes landfall.

\*    \*    \*    \*    \*